(12) United States Patent
Leung et al.

(10) Patent No.: US 6,784,048 B2
(45) Date of Patent: Aug. 31, 2004

(54) METHOD OF FABRICATING A DRAM CELL HAVING A THIN DIELECTRIC ACCESS TRANSISTOR AND A THICK DIELECTRIC STORAGE

(75) Inventors: Wingyu Leung, Cupertino, CA (US);
Fu-Chieh Hsu, Saratoga, CA (US)

(73) Assignee: Monolithic Systems Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/231,800

(22) Filed: Aug. 28, 2002

(65) Prior Publication Data

US 2003/0001181 A1 Jan. 2, 2003

Related U.S. Application Data

(60) Division of application No. 09/772,434, filed on Jan. 29, 2001, now Pat. No. 6,468,855, which is a continuation-in-part of application No. 09/427,383, filed on Oct. 25, 1999, now Pat. No. 6,509,595, which is a continuation-in-part of application No. 09/332,757, filed on Jun. 14, 1999, now Pat. No. 6,147,914, which is a continuation-in-part of application No. 09/134,488, filed on Aug. 14, 1998, now Pat. No. 6,075,720.

(51) Int. Cl.$^7$ .......................................... H01L 21/8242
(52) U.S. Cl. ....................................................... 438/239
(58) Field of Search ................................. 438/239, 241, 438/238

(56) References Cited

U.S. PATENT DOCUMENTS

| | | |
|---|---|---|
| 5,198,995 A | 3/1993 | Dennard et al. |
| 5,267,201 A | 11/1993 | Foss et al. |
| 5,297,104 A | 3/1994 | Nakashima |
| 5,371,705 A | 12/1994 | Nakayama et al. |
| 5,377,139 A | 12/1994 | Lage et al. |
| 5,394,365 A | 2/1995 | Tsukikawa |
| 5,416,034 A | 5/1995 | Bryant |
| 5,600,598 A | 2/1997 | Skjaveland et al. |
| 5,694,355 A | 12/1997 | Skjaveland et al. |
| 5,703,827 A | 12/1997 | Leung et al. |

(List continued on next page.)

FOREIGN PATENT DOCUMENTS

| | | |
|---|---|---|
| DE | 3543937 | 6/1986 |
| DE | 4034169 A1 | 5/1991 |

(List continued on next page.)

OTHER PUBLICATIONS

"A 768k Embedded DRAM for 1.244 Gb/s ATM Switch in a 0.8μm Logic Process", Gillingham et al., 1996 IEEE International Solid State Circuits Conference, pp. 262–263.

(List continued on next page.)

*Primary Examiner*—David Nelms
*Assistant Examiner*—Quoc Hoang
(74) *Attorney, Agent, or Firm*—Bever, Hoffman & Harms, LLP; E. Eric Hoffman

(57) ABSTRACT

A memory system that includes a DRAM cell that includes an access transistor and a storage capacitor. The storage capacitor is fabricated by forming a polysilicon crown electrode, a dielectric layer overlying the polysilicon crown, and a polysilicon plate electrode overlying the dielectric layer. A first set of thermal cycles are performed during the formation of the storage capacitor to form and anneal the elements of the capacitor structure. Subsequently, shallow P+ and/or N+ regions are formed by ion implantation, and metal salicide is formed. As a result, the relatively high first set of thermal cycles required to form the capacitor structure does not adversely affect the shallow P+ and N+ regions or the metal salicide. A second set of thermal cycles, which are comparable to or less than the first set of thermal cycles, are performed during the formation of the shallow regions and the metal salicide.

11 Claims, 27 Drawing Sheets

U.S. PATENT DOCUMENTS

| | | | |
|---|---|---|---|
| 5,789,291 A | | 8/1998 | Sung |
| 5,863,819 A | * | 1/1999 | Gonzalez .................... 438/238 |
| 5,963,838 A | | 10/1999 | Yamamoto et al. |
| 5,986,947 A | | 11/1999 | Choi et al. |
| 6,009,023 A | | 12/1999 | Lu et al. |
| 6,104,055 A | | 8/2000 | Watanabe |
| 6,352,890 B1 | | 3/2002 | Sutcliffe |

FOREIGN PATENT DOCUMENTS

| | | |
|---|---|---|
| EP | 0460694 A2 | 12/1991 |
| EP | 0493659 A2 | 7/1992 |
| EP | 0632462 A2 | 1/1995 |
| JP | 60113461 | 10/1985 |
| JP | 01150353 | 6/1989 |
| JP | 03136275 | 9/1991 |
| JP | 03259566 | 11/1991 |
| JP | 07094596 | 4/1995 |
| JP | 08063964 | 3/1996 |
| WO | WO0101450 | 1/2001 |

OTHER PUBLICATIONS

P.R. Gray and R.G. Meyer; "Analysis And Design Of Analog Intgrated Circuits",; pp. 330–333.

"An Embedded DRAM Module using A Dual Sense Amplifier Architecture In A Logic Process", Hashimoto et al., 1997 IEEE International Solid State Circuits Conference, pp. 64–65, 431.

P.R. Gray and R.G. Meyer; "Analysis And Design Of Analog Integratd Circuits"; pp. 330–333.

"An Embedded DRAM Module using A Dual Sense Amplifier Architecture In A Logic Process", Hashimoto et al., 1997 IEEE International Solid State Circuits Conference, pp. 64–65, 431.

"A 768k Embedded DRAM for 1.244 Gb/s ATM Swicth in a 0.8µm Logic Process", Gillingham et al., 1996 IEEE International Solid State Circuits Conference, pp. 262–263.

* cited by examiner

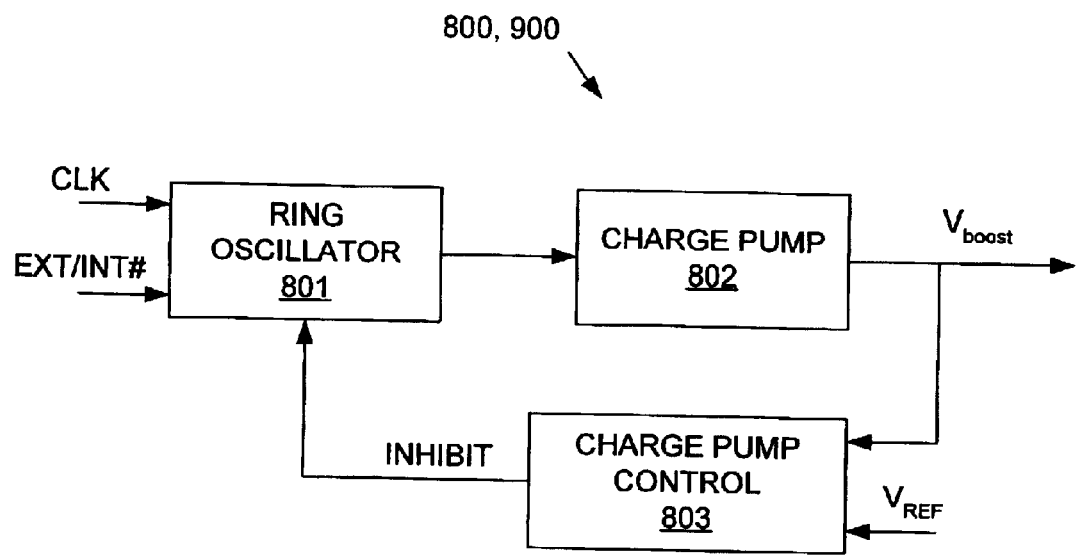
FIG. 9A
(PRIOR ART)
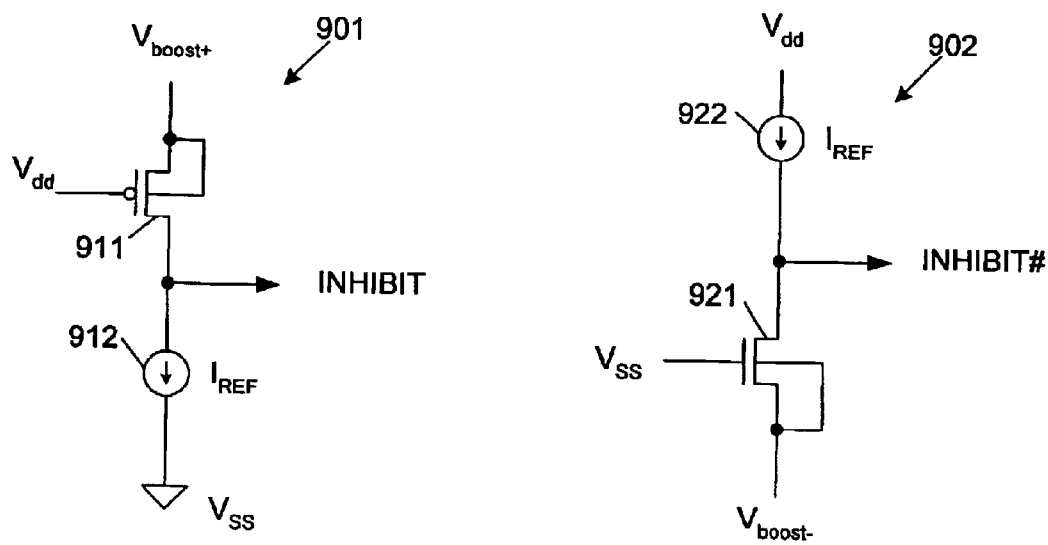
FIG. 9B
(PRIOR ART)
FIG. 9C
(PRIOR ART)

METHOD OF FABRICATING A DRAM CELL HAVING A THIN DIELECTRIC ACCESS TRANSISTOR AND A THICK DIELECTRIC STORAGE

RELATED APPLICATIONS

The present application is a divisional of commonly owned U.S. patent application Ser. No. 09/772,434, "REDUCED TOPOGRAPHY DRAM CELL FABRICATED USING A MODIFIED LOGIC PROCESS AND METHOD FOR OPERATING SAME" filed Jan. 29, 2001 now U.S. Pat. 6,468,855 by Wingyu Leung and Fu-Chieh Hsu, which is a continuation-in-part of commonly owned U.S. patent application Ser. No. 09/427,383, "DRAM CELL FABRICATED USING A MODIFIED LOGIC PROCESS AND METHOD FOR OPERATING SAME" by Wingyu Leung and Fu-Chieh Hsu, filed Oct. 25, 1999, now U.S. Pat. 6,509,595 which is a continuation in part of commonly owned U.S. Pat. No. 6,147,914, "ON-CHIP WORD LINE VOLTAGE GENERATION FOR DRAM EMBEDDED IN LOGIC PROCESS" by Wingyu Leung and Fu-Chieh Hsu, issued Nov. 14, 2000, which is a continuation-in-part of commonly owned U.S. Pat. No. 6,075,720, "MEMORY CELL FOR DRAM EMBEDDED IN LOGIC" by Wingyu Leung and Fu-Chieh Hsu, issued Jun. 13, 2000.

BACKGROUND OF THE INVENTION

1. Field of the Invention

The present invention relates to Dynamic Random Accessible Memory (DRAM). More particularly, this invention relates to DRAM fabricated by slightly modifying a conventional logic process. This invention further relates to the on-chip generation of precision voltages for the operation of DRAM embedded or fabricated using a conventional logic process.

2. Related Art

FIG. 1A is a schematic diagram of a conventional DRAM cell 100 that is fabricated using a conventional logic process. FIG. 1B is a cross sectional view of DRAM cell 100. As used herein, a conventional logic process is defined as a semiconductor fabrication process that uses only one layer of polysilicon and provides for either a single-well or twin-well structure. DRAM cell 100 consists of a p-channel MOS access transistor 1 having a gate terminal 9 connected to word line 3, a drain terminal 17 connected to bit line 5, and a source terminal 18 connected to the gate 11 of a p-channel MOS transistor 2. The connection between source terminal 18 and the gate 11 undesirably increases the layout area of DRAM cell 100. P-channel transistor 2 is configured to operate as a charge storage capacitor. The source and drain 19 of transistor 2 are commonly connected. The source, drain and channel of transistor 2 are connected to receive a fixed plate bias voltage $V_{pp}$. The $V_{pp}$ voltage is a positive boosted voltage that is higher than the positive supply voltage $V_{dd}$ by more than a transistor threshold voltage $V_t$.

As used herein, the electrode of the charge storage capacitor is defined as the node coupled to the access transistor, and the counter-electrode of the charge storage capacitor is defined as the node coupled to receive a fixed plate bias voltage. Thus, in DRAM cell 100, the gate 11 of transistor 2 forms the electrode of the charge storage capacitor, and the channel region of transistor 2 forms the counter-electrode of the charge storage capacitor.

To improve soft-error-rate sensitivity of DRAM cell 100, the cell is fabricated in an n-well region 14, which is located in a p-type substrate 8. To minimize the sub-threshold leakage of access transistor 1, n-well 14 is biased at the $V_{pp}$ voltage (at n-type contact region 21) However, such a well bias increases the junction leakage. As a result, the bias voltage of n-well 14 is selected such that the sub-threshold leakage is reduced without significantly increasing the junction leakage. When storing charge in the storage capacitor, bit line 5 is brought to the appropriate level (i.e., $V_{dd}$ or $V_{SS}$) and word line 3 is activated to turn on access transistor 1. As a result, the electrode of the storage capacitor is charged. To maximize the stored charge, word line 3 is required to be driven to a negative boosted voltage $V_{bb}$ that is lower than the supply voltage $V_{SS}$ minus the absolute value of the threshold voltage ($V_{tp}$) of access transistor 1.

In the data retention state, access transistor 1 is turned off by driving word line 3 to the $V_{dd}$ supply voltage. To maximize the charge storage of the capacitor, the counter electrode is biased at the positive boosted voltage $V_{pp}$. The plate voltage $V_{pp}$ is limited by the oxide breakdown voltage of the transistor 2 forming the charge storage capacitor.

DRAM cell 100 and its variations are documented in U.S. Pat. No. 5,600,598, entitled "Memory Cell and Wordline Driver For Embedded DRAM in ASIC Process," by K. Skjaveland, R. Township, P. Gillingham (hereinafter referred to as "Skjaveland et al."), and "A 768 k Embedded DRAM for 1.244 Gb.s ATM Switch in a 0.8 $\mu$m Logic Process," P. Gillingham, B. Hold, I. Mes, C. O'Connell, P. Schofield, K. Skjaveland, R. Torrance, T. Wojcicki, H. Chow, Digest of ISSCC, 1996, pp. 262–263 (hereinafter referred to as "Gillingham et al.). Both Skjaveland et al. and Gillingham et al. describe memory cells that are contained in an n-well formed in a p-type substrate.

FIG. 2 is a schematic diagram of a word line control circuit 200 including a word line driver circuit 201 and a word line boost generator 202 described by Gillingham et al. Word line control circuit 200 includes p-channel transistors 211–217, inverters 221–229, NAND gates 231–232 and NOR gate 241, which are connected as illustrated. Word line driver 201 includes p-channel pull up transistor 211, which enables an associated word line to be pulled up to the $V_{dd}$ supply voltage. P-channel pull down transistors 212–217 are provided so that the word line can be boosted down to a negative voltage (i.e., −1.5V) substantially below the negative supply voltage $V_{SS}$. However, the p-channel pull down transistors 212–217 have a drive capability much smaller (approximately half) than an NMOS transistor of similar size. As a result, the word line turn on of Gillingham et al. is relatively slow (>10 ns). Furthermore, in the data retention state, word line driver 201 only drives the word line to the $V_{dd}$ supply voltage. As a result, the sub-threshold leakage of the access transistor in the memory cells may not be adequately suppressed.

DRAM cells similar to DRAM cell 100 have also been formed using n-channel transistors fabricated in a p-type well region. To maximize stored charge in such n-channel DRAM cells during memory cell access, the associated word line is driven to a voltage higher than the supply voltage $V_{dd}$ plus the absolute value of the threshold voltage ($V_{tn}$) of the access transistor. In the data retention state, the n-channel access transistor is turned off by driving the word line to $V_{SS}$ supply voltage (0 Volts). To maximize the charge storage of the capacitor in an n-channel DRAM cell, the counter electrode is biased at a plate voltage $V_{bb}$ that is lower than the $V_{SS}$ supply voltage.

A prior art scheme using n-channel DRAM cells includes the one described by Hashimoto et al. in "An Embedded DRAM Module using a Dual Sense Amplifier Architecture in a Logic Process", 1997 IEEE International Solid-State Circuits Conference, pp. 64–65 and 431. A p-type substrate is used, such that the memory cells are directly in contact with the substrate and are not isolated by any well structure. In the described design, substrate bias is not permitted. Moreover, application of a negative voltage to the word line is not applicable to ASICs that restrict substrate biasing to be zero. Consequently, the architecture achieves a negative gate-to-source voltage ($V_{gs}$) by limiting bit line swing. The negative $V_{gs}$ voltage reduces sub-threshold leakage in the memory cells. Hashimoto et al. fails to describe the structure of the word line driver.

It would therefore be desirable to have a word line driver circuit that improves the leakage currents in DRAM cells fabricated using a conventional logic process. Moreover, it would be desirable to have improved methods for biasing DRAM cells fabricated using a conventional logic process.

SUMMARY

Accordingly, the present invention provides a memory system that includes a dynamic random access memory (DRAM) cell, a word line, and a CMOS word line driver fabricated using a conventional logic process. In a particular variation of this embodiment, the DRAM cell includes an access transistor having a thin gate oxide and a capacitor structure having a thick gate oxide of the type typcially used in high voltage I/O devices.

In other embodiments of the present invention, a DRAM cell is fabricated by slightly modifying a conventional logic process. In one such embodiment, the DRAM cell is fabricated by fabricating a crown electrode and a plate electrode of the DRAM cell substantially in a recessed area below the surface of a silicon wafer. The crown and plate electrodes are fabricated prior to the formation of the gate electrode of the access transistor. The recessed area can be formed by etching into a buried field oxide layer. The recessed area in the field oxide is located adjacent to an exposed portion of the silicon wafer. The crown electrode is formed over the recessed area of the field oxide and the exposed portion of the silicon wafer. Out-diffusion from the crown electrode causes a doped contact region to be formed in the previously exposed portion of the silicon wafer. The crown electrode includes a base region located at the bottom of the recessed area, and sidewalls that extend up walls of the recessed area. A dielectric layer is located over the crown electrode. The plate electrode is located over the dielectric layer, thereby completing the capacitor of the DRAM cell. The plate electrode extends over the base region and the sidewalls of the crown electrode.

After the capacitor has been formed, a gate dielectric layer for the access transistor is thermally grown. The access transistor is then formed over the gate dielectric using conventional logic process steps. The access transistor is positioned such that the source of the access transistor is continuous with the doped contact region, thereby coupling the access transistor to the capacitor. The configuration of the storage electrode and the plate electrode advantageously results in a DRAM cell having a high capacitance, a small layout area and a reduced surface topography. This configuration further requires only minimal modifications to a conventional logic process. More specifically, two additional masking steps and two additional polysilicon layers are used to form the capacitor. The temperature cycles associated with the capacitor formation do not subsequently affect the formation of N+ and P+ shallow junctions or the formation of salicide during fabrication of the access transistor. In addition, the internal node of the capacitor is substantially free of salicide for reduced leakage current.

In a variation of this embodiment, the crown electrode and the gate electrode are both formed from the same polysilicon layer.

The word line driver is controlled to selectively provide a positive boosted voltage and a negative boosted voltage to the word line, thereby controlling access to the DRAM cell.

A positive boosted voltage generator is provided to generate the positive boosted voltage, such that the positive boosted voltage is greater than the $V_{dd}$ supply voltage but less than the $V_{dd}$ supply voltage plus one diode voltage drop ($V_j$) of about 0.6 Volts.

Similarly, a negative boosted voltage generator is provided to generate the negative boosted voltage, such that the negative boosted voltage is less than the $V_{SS}$ supply voltage, but greater than the $V_{SS}$ supply voltage minus one diode voltage drop ($V_j$) of about 0.6 Volts.

A coupling circuit is provided between the word line driver and one of the positive or negative boosted voltage generators. For example, if the DRAM cell is constructed from PMOS transistors, then the coupling circuit couples the word line driver to the negative boosted word line generator. When the DRAM cell is being accessed, the coupling circuit couples the word line driver to the negative boosted voltage, thereby turning on the p-channel access transistor of the DRAM cell.

Conversely, if the DRAM cell is constructed from NMOS transistors, then the coupling circuit couples the word line driver to the positive boosted word line generator. When the DRAM cell is being accessed, the coupling circuit couples the word line driver to the positive boosted voltage, thereby turning on the n-channel access transistor of the DRAM cell.

The positive boosted voltage generator includes a charge pump control circuit that limits the positive boosted voltage to a voltage less than $V_{dd}$ plus one diode voltage drop, $V_j$. Similarly, the negative boosted voltage generator includes a charge pump control circuit that limits the negative boosted voltage to a voltage greater than $V_{SS}$ minus one diode voltage drop, $V_j$. In a particular embodiment, the positive boosted voltage and the negative boosted voltage are referenced to transistor threshold voltages.

In deep sub-micron logic processes having transistors with gate lengths equal to or less than 0.15 microns, the threshold voltage of the thin oxide transistors is less than 0.5 Volts. This threshold voltage is less than the P-N junction voltage of about 0.6 Volts. During a restore or write operation, the negative boosted voltage is applied to the gate of the access transistor (i.e., the cell word line) through an n-channel driver transistor, which is formed in a p-type substrate. The negative boosted voltage helps to charge the storage capacitor to a voltage substantially close to the $V_{SS}$ supply voltage during the restore or write operation. Theoretically, the negative boosted voltage should be at least one p-channel threshold voltage (plus the additional threshold voltage shift due to body effect) below $V_{SS}$ to charge the electrode of the storage capacitor to a voltage equal to $V_{SS}$. However, in a logic process where the p-substrate is biased at the $V_{SS}$ potential, applying a bias equal to or less than 0.6 V to the source of the n-channel driver transistor will cause the N+ source junction of the n-channel transistor to turn on. As a result, large substrate current will flow from the negative boosted voltage generator to the substrate, thereby wasting power and increasing the possibility of latch-up. It is important to choose the absolute voltage of a negative boosted voltage to be substantially equal to the absolute value of the threshold voltage of a p-channel transistor ($V_{tp}$), but smaller than the turn on voltage of a P-N junction. For example, a negative boosted voltage between 0.3 and 0.4 Volts may be used in processes having a $V_{tp}$ of 0.5 Volts or less.

The present invention will be more fully understood in view of the following description and drawings.

BRIEF DESCRIPTION OF THE DRAWINGS

FIGS. 4Y–4AA are cross sectional views of a DRAM cell in accordance with yet another embodiment of the present invention during various stages of fabrication.

FIG. 9A is a block diagram of $V_{CCB}$ and $V_{SSB}$ boosted voltage generators in accordance with one embodiment of the present invention.

FIG. 9B is a simplified schematic diagram of a charge pump control circuit used in a conventional positive boosted voltage generator.

FIG. 9C is a simplified schematic diagram of a charge pump control circuit used in a conventional negative boosted voltage generator.

DETAILED DESCRIPTION

Except where specifically noted, the following describes the voltages and biasing of a DRAM memory fabricated using a conventional logic process which is a single or twin well process with a single polycrystalline silicon layer and one or more layers of metal. In the described examples, the positive supply voltage is designated as supply voltage $V_{dd}$. In general, the positive supply voltage $V_{dd}$ can have a nominal value such as 3.3 Volts, 2.5 Volts, 1.8 Volts, etc., depending on the fabrication process. The ground supply voltage, having a nominal value of 0 Volts, is designated as supply voltage $V_{SS}$. A diode drop (or P-N junction) voltage, having a nominal value of about 0.6 Volts, is designated $V_j$.

Figure 1A:
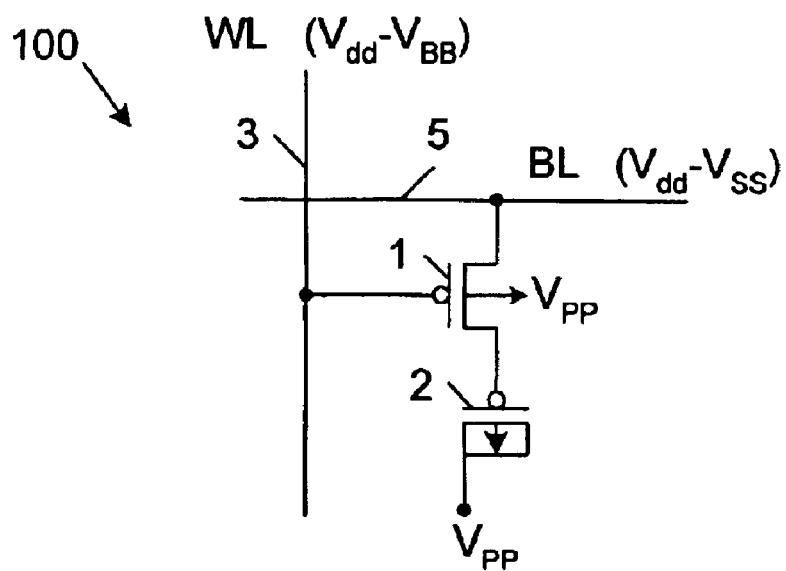
FIG. 1A is a schematic diagram of a conventional DRAM memory cell formed by p-channel MOS transistors fabricated using a conventional logic process.
Figure 1B:
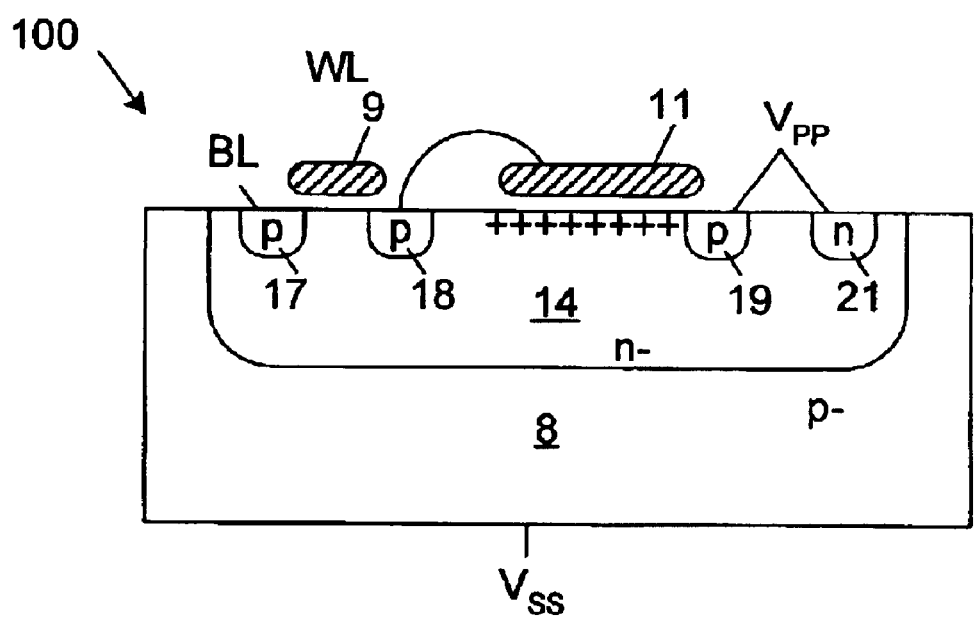
FIG. 1B is a cross sectional diagram of the DRAM memory cell of FIG. 1A.
Figure 2:
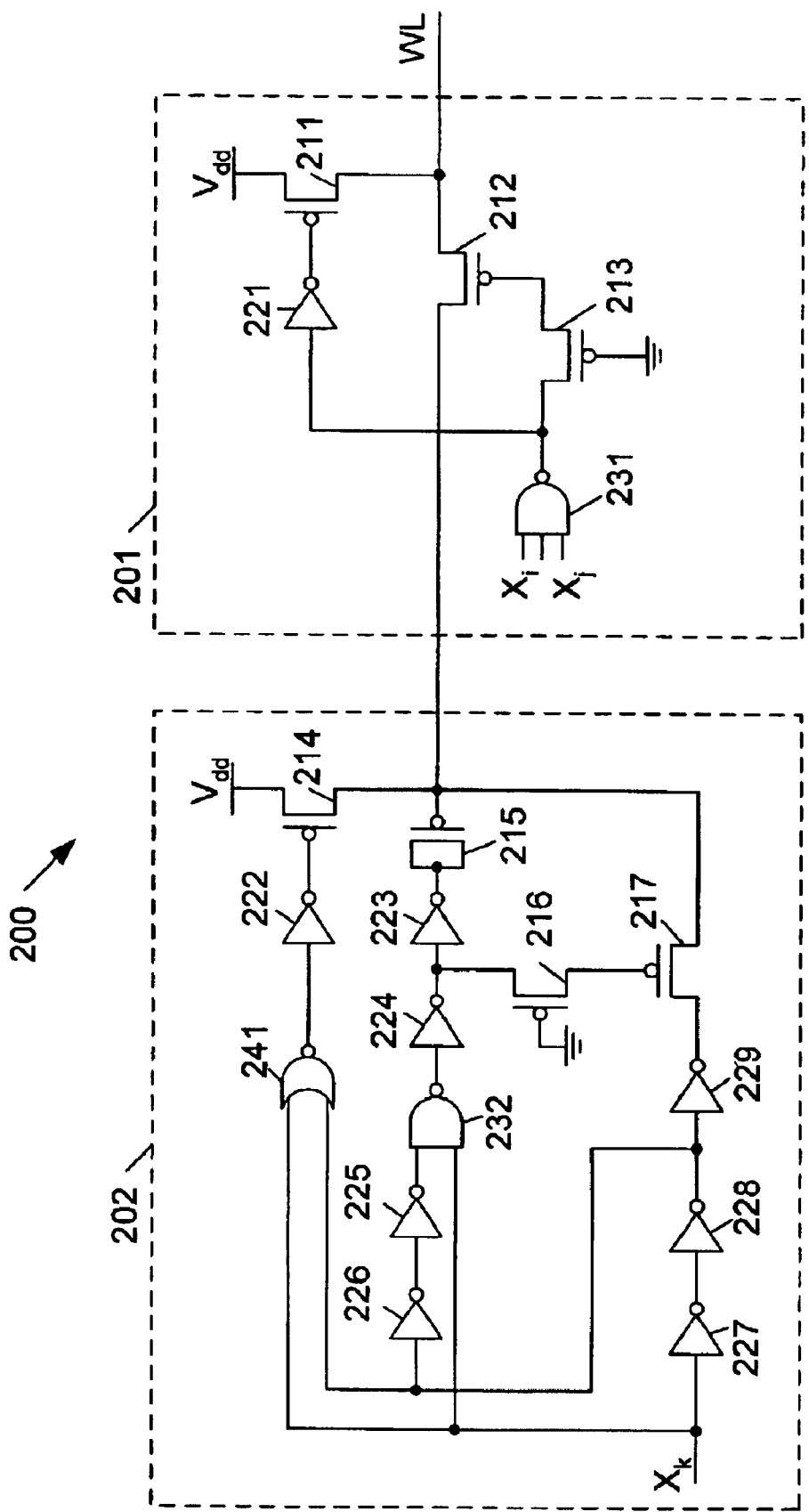
FIG. 2 is a schematic diagram of a conventional word line control circuit, including a word line driver and a word line voltage generator.
Figure 3A:
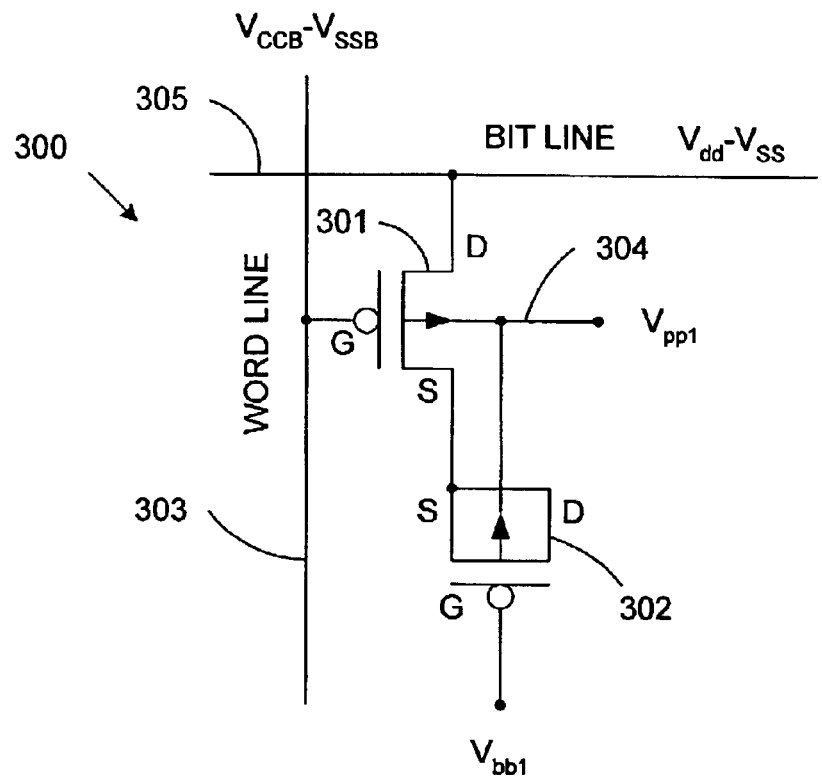
FIG. 3A is a schematic diagram of a DRAM memory cell that is supplied by voltage sources in accordance with one embodiment of the present invention.

As shown in FIG. 3A, a DRAM memory cell used in one embodiment consists of a p-channel access transistor 301 and a p-channel storage transistor 302 that is configured as a storage capacitor. The gate of the access transistor 301 is connected to word line 303 and the drain of access transistor 301 is connected to bit line 305. The source of access transistor 301 is coupled to the source region of transistor 302. In the described embodiment, only the source region of transistor 302 is actually formed (i.e., there is no drain region of transistor 302). In another embodiment, both the source and drain regions are formed, and these regions are commonly connected to the source of access transistor 301. The channel of transistor 302 forms the electrode of the storage capacitor, and the gate of transistor 302 forms the counter-electrode of the storage capacitor. The channel of storage transistor 302 (i.e., the electrode of the storage capacitor) is coupled to the source of access transistor 301. The gate of transistor 302 (i.e., the counter-electrode of the storage capacitor) is connected to receive a negative boosted bias voltage $V_{bbl}$. The bias voltage $V_{bbl}$ is limited by the break-down voltage ($V_{bd}$) of the gate oxide of capacitor 302 and the highest voltage ($V_l$) stored on the electrode. In general, bias voltage $V_{bbl}$ is set to a voltage that is greater than $V_l$ minus $V_{bd}$. In the preferred embodiment, $V_l$ is equal to the positive supply voltage $V_{dd}$, and bias voltage $V_{bbl}$ is set to −0.3 Volts.

In general, the bias voltage $V_{bbl}$ is selected to have a magnitude less than one diode voltage drop. That is, the bias voltage $V_{bbl}$ is selected to have a magnitude less than about 0.6 Volts. The negative bias voltage $V_{bbl}$ linearizes the operation of storage capacitor 302 by increasing the capacitance of capacitor 302 when the electrode is charged to the $V_{dd}$ supply voltage. Without the negative plate bias $V_{bbl}$, the capacitance of capacitor 302 tends to decrease rapidly as the voltage across the capacitor becomes smaller than the threshold voltage of the MOS structure.

Figure 3B:
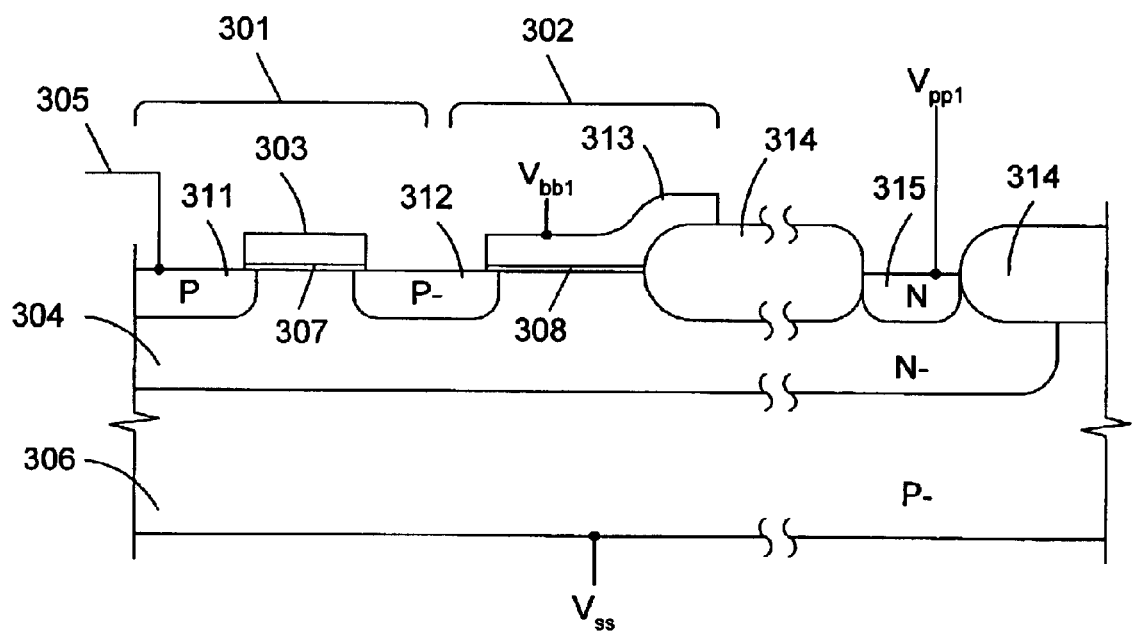
FIGS. 3B and 3C are cross sectional views of the DRAM memory cell of FIG. 3A in accordance with various embodiments of the present invention.

As illustrated in FIG. 3B, DRAM memory cell 300 is contained in an n-doped well 304 of a p-type monocrystalline silicon substrate 306. Multiple memory cells can share the same n-well 304. N-well 304 is biased to a boosted positive voltage ($V_{ppl}$) that is greater than the $V_{dd}$ supply voltage by a voltage that is approximately equal to the absolute value of the threshold voltage ($V_{tp}$) of p-channel access transistor 301. In addition, the boosted positive voltage $V_{ppl}$ is selected to be lower than the oxide break down voltage of p-channel access transistor 301. N-well 304 is biased by a connection to n-type contact region 315. In the present embodiment, the $V_{ppl}$ voltage is controlled to be approximately 0.3 Volts greater than the $V_{dd}$ supply voltage (i.e., $V_{tp}$=0.3 Volts). Applying the $V_{ppl}$ voltage to n-well 304 decreases the sub-threshold leakage of access transistor 301, and minimizes the possibility of forward biasing the junction between the electrode of capacitor 302 and n-well 304 due to supply noise. However, applying the $V_{ppl}$ voltage to n-well 304 also increases the junction leakage at the electrode of storage capacitor 302, especially at higher voltages.

When data is written to memory cell 300, bit line 305 is coupled to the $V_{dd}$ supply voltage to write a logic zero data value, or to the $V_{SS}$ supply voltage to write a logic one data value. In addition, word line 303 is coupled to receive a word line voltage $V_{SSB}$, which has a potential of about −0.3 Volts. In accordance with one embodiment, the $V_{SSB}$ voltage level is chosen to be −0.2 Volts to −0.5 Volts, as compared to −1.0 Volts or more negative in a traditional DRAM implementation. This is greater than the $V_{SS}$ supply voltage minus one diode voltage drop. Generation of the $V_{SSB}$ voltage is described in more detail below.

When memory cell 300 is in the data retention state, bit line 305 is pre-charged to a voltage of about one half the $V_{dd}$ supply voltage. Sub-threshold leakage of memory cell 300 tends to be higher when bit line 305 or the electrode of capacitor 302 is at a potential close to the $V_{dd}$ supply voltage. This sub-threshold leakage is more severe for sub-micron transistors because of their lower threshold voltages (e.g., $V_{tp}$=−0.5 Volts or less). To reduce the sub-threshold leakage during the data retention state, word line 303 is coupled to an internally generated positive boosted voltage ($V_{CCB}$) which has a potential about 0.3 Volts greater than the $V_{dd}$ supply voltage. In accordance with one embodiment, the $V_{CCB}$ voltage level is chosen to be 0.2 Volts to 0.5 Volts greater than the $V_{dd}$ supply voltage. This is less than the $V_{dd}$ supply voltage plus one diode voltage drop. This is different from the conventional memory cells described above, in which the word line is coupled to the $V_{dd}$ supply voltage during the data retention state. Generation of the positive boosted voltage $V_{CCB}$ is described in more detail below.

P-channel access transistor 301 and p-channel storage transistor 302 of FIG. 3B include thin gate dielectric layers 307 and 308, respectively. These thin gate dielectric layers are typically used for fabricating the internal logic of an integrated circuit. For example, in a 0.18 micron logic process, thin gate dielectric layer 307 and 308 typically have a thickness of about 2.5 to 4.0 nm.

For deep sub-micron MOS devices having gate lengths less than 0.15 microns and gate oxide thicknesses less than 30 Angstroms, the gate tunneling current through the MOS storage transistor 302 becomes significant (i.e., greater than 5 pA). Such a gate tunneling current through the storage transistor reduces the stored charge, and therefore significantly increases the required refresh rate of the memory cell. Because the gate tunneling current increases exponentially with the decrease in gate oxide thickness, it is desirable to use a thick oxide device for the storage transistor 302, thereby reducing the tunneling current and maintaining a reasonable refresh period in the memory cell.

Figure 3C:
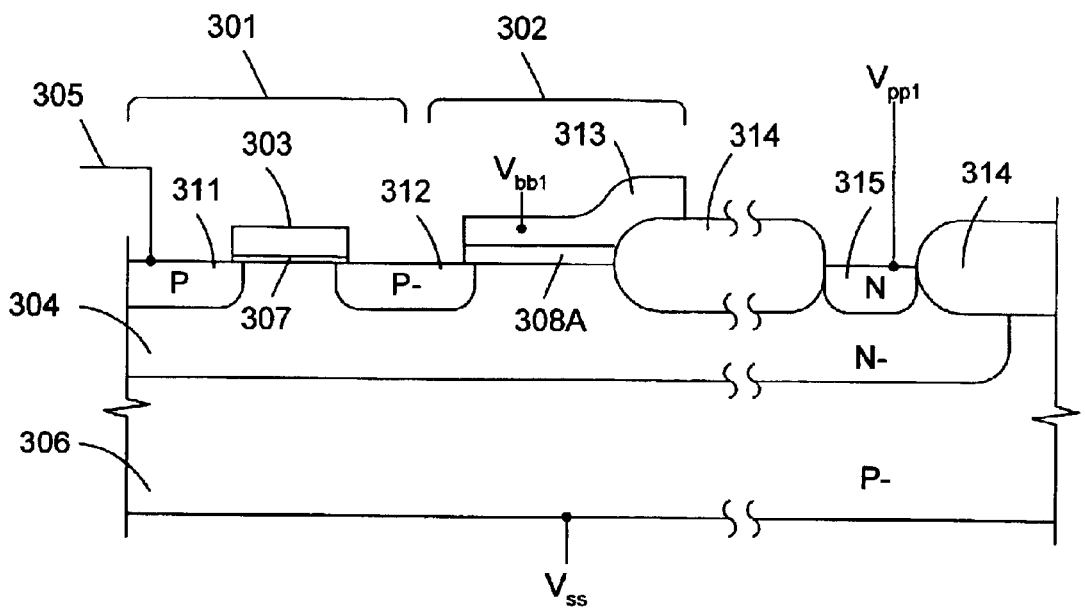

Thus, in another embodiment of the present invention, which is illustrated in FIG. 3C, the thin gate dielectric layer 308 of the capacitor structure is replaced with a thick gate oxide layer 308A. Thick gate oxide layer 308A is available in a conventional dual-oxide logic process. Dual-oxide logic processes are commonly used to fabricate semiconductor circuits that use both high performance thin oxide transistors and high voltage thick oxide transistors. The high performance thin gate oxide transistors are used to construct the majority of the functional blocks, and the thick gate oxide transistors are used to construct I/O circuits and special functional blocks that require higher voltage compliance. The thick gate oxide transistors are therefore not conventionally used to form storage transistors (capacitors) of a DRAM cell.

Because the thick gate oxide layer is available in the conventional dual oxide logic process, no additional processing steps are required to fabricate thick gate oxide layer 308A. Optionally, the thick oxide layer 308A can also be formed separately using an additional masking step, so that this layer can be thinner than the I/O oxide layer (which has a thickness of typically 50 to 70 Angstroms). The thick gate oxide layer 308A is significantly thicker than the thin gate oxide layer 307. For example, in a 0.13 micron logic process, the thick gate oxide layer 308A has a thickness of about 25–50 Angstroms and the thin gate oxide layer 307 has a thickness of about 15–20 Angstroms. In one embodiment, thick oxide layer 308A will be about 20 percent thicker than thin gate oxide layer 307. Thick gate dielectric oxide 308A advantageously reduces the tunneling current through p-channel storage transistor 302.

In an alternate embodiment, a shallow trench or recessed region is formed underneath thick gate oxide layer 308A using an additional masking step to increase the surface area of the thick gate oxide layer 308A and thereby increase the resulting capacitance.

Figure 3D:
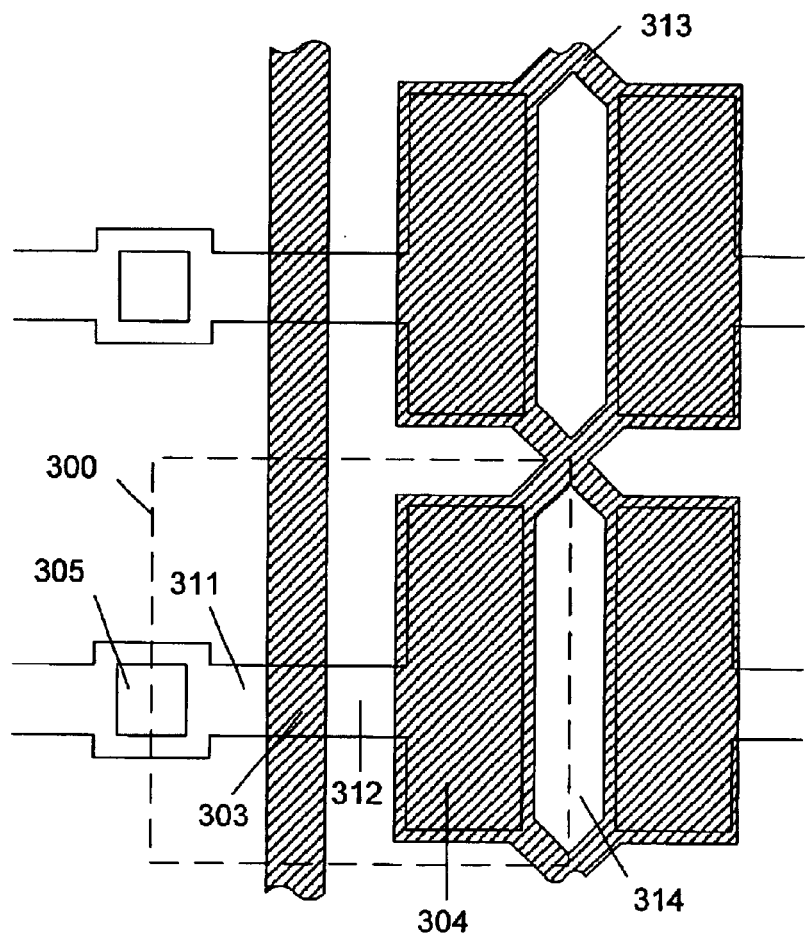
FIG. 3D is a layout view of the DRAM memory cell of FIG. 3A in accordance with one embodiment of the present invention.

FIG. 3D shows the layout of memory cell 300 in accordance with one embodiment of the present invention. The connection to bit line 305 is shared between two neighboring cells, and the upper plate 313 of capacitor 302 connects two rows of adjacent cells parallel to the wordline. The capacitors of adjacent cells are electrically isolated through field oxide (FOX) region 314, e.g., at the minimum spacing allowed by the design rules. Because capacitor plate 313 is biased at the $V_{bbl}$ level to allow the maximum turn-on of the p-channel capacitor, a worse case biasing exists over field oxide (FOX) 314 with maximum leakage current that can flow between neighboring cell storage nodes. To minimize such field leakage current, the capacitor plate 313 is allowed to cross-over field oxide 314 only along diagonal corners of adjacent storage nodes. This forces the possible leakage path between adjacent cells to be 1.414 times the minimum FOX isolation spacing, and at the same time reduces the portion of the storage node perimeter (at minimum spacing) that is adversely gated by the capacitor plate 313 to be less than 25% of the total storage node perimeter (which is the channel region of capacitor 302) and thereby minimizes possible leakage current.

Figure 3E:
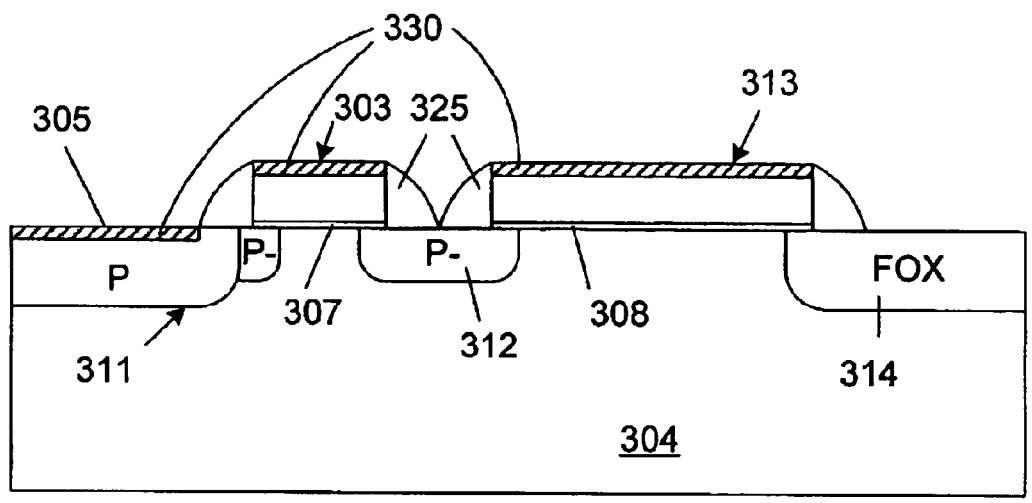
FIGS. 3E–3F are cross sectional views of the DRAM memory cell of FIG. 3A in accordance with other embodiments of the present invention.

FIG. 3E shows an enlarged cross-section view of p-channel access transistor 301 and p-channel capacitor 302 in accordance with another embodiment of the present invention. In this embodiment, the normal p-type heavy source/drain implant and the source/drain salicidation are excluded from the p-type connecting region 312. This arrangement reduces junction leakage current as well as gate-induced drain leakage (GIDL) that can degrade the charge retention time of the storage node. In a conventional logic process, the formation of a p-channel transistor usually follows the sequence of (i) patterning and etching the polysilicon gate, (ii) using ion implantation to lightly dope the source/drain regions right at the gate edges, thereby forming p-LDD regions, (iii) forming insulating sidewall spacers, (iv) forming salicide (self-aligned silicide) on the exposed silicon surfaces, and (v) using ion implantation to heavily dope the source/drain regions on the exposed silicon surfaces, thereby forming p-S/D regions. The two-step formation of the p-LDD and p-S/D regions provide for high conduction current and good leakage current control at the same time. The p-S/D region is usually much more heavily doped to have low resistivity than the p-LDD region. As a result, the junction breakdown voltage is lower and leakage current of the p-S/D region is much higher than that of the p-LDD region. The source/drain salicide reduces the source/drain resistivity further but also degrades the junction leakage further. Therefore, it is important to exclude as much heavy p-type doping and salicide formation in the storage node (i.e., region 312) as possible.

In the present invention, region 312 is laid out with minimum polysilicon gate spacing, which is comparable to twice the size of the insulating sidewall spacers 325. With this layout arrangement, p-S/D doping and salicide are effectively excluded from region 312 without need for additional processing steps.

Figure 3F:
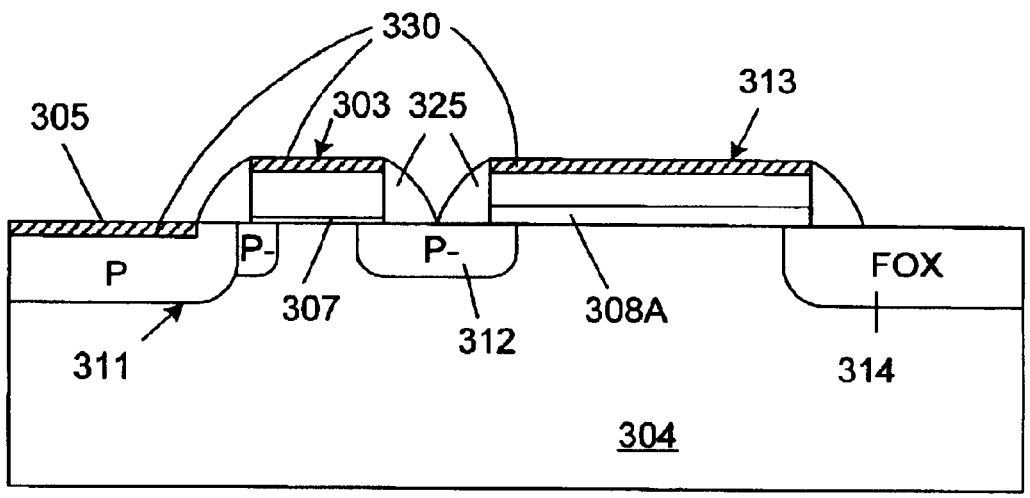

As illustrated in FIG. 3F, thin gate dielectric layer 307 is formed under gate electrode 303 of the access transistor, while a thick gate dielectric layer 308A is formed under capacitor structure 313 in another embodiment of the present invention.

The DRAM cells of FIGS. 3A–3E may similarly be implemented using an n-channel access transistor and capacitor, provided that these elements are fabricated in a p-doped well located in either an n-doped substrate or in a deep n-doped well of a p-doped substrate.

FIGS. 4A–4J are cross sectional views of a DRAM cell 40 in accordance with another embodiment of the present invention during various stages of fabrication. In general, DRAM cell 40 includes a capacitor structure having a crown and plate configuration, which is formed using two additional polysilicon layers. These additional polysilicon layers are formed prior to the formation of N+ and P+ shallow junctions and prior to the formation of salicide. Using two additional polysilicon layers enables the formation of a smaller capacitor structure and therefore a smaller DRAM cell.

Figure 4A:
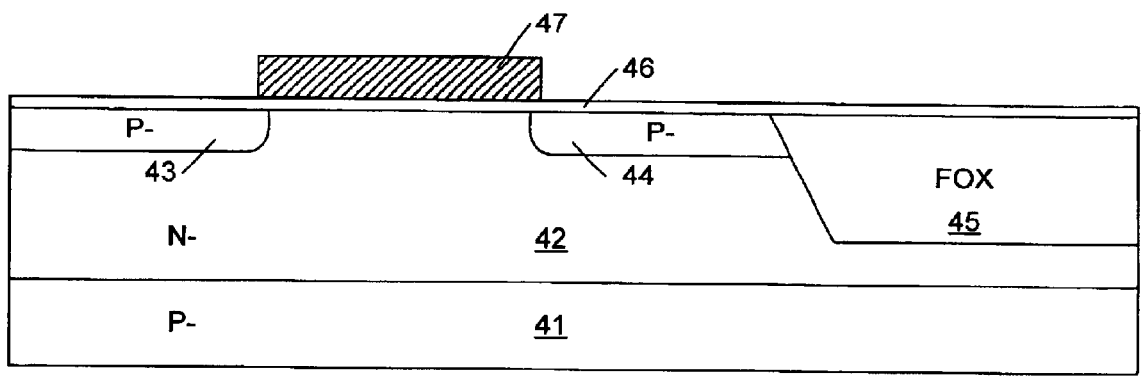
FIGS. 4A–4J are cross sectional views of a DRAM cell in accordance with another embodiment of the present invention during various stages of fabrication.

As illustrated in FIG. 4A, an n-type well region 42 is formed in a p-type monocrystalline silicon substrate 41. In the described example, substrate 41 has a <1, 0, 0> crystalline orientation and a dopant concentration of about $1 \times 10^{16}/cm^3$. N-well 42, which is formed by conventional process steps such as ion implantation, has a dopant concentration of about $1 \times 10^{17}/cm^3$. Other crystal orientations and concentrations can be used in other embodiments of the invention. In addition, the conductivity types of the various regions can be reversed in other embodiments with similar results.

In the described embodiment, field oxide 45 is formed using shallow trench isolation (STI) techniques. In STI techniques, trenches are etched in silicon substrate 41, and these trenches are then filled with silicon oxide. The upper surface of the resulting structure is then planarized by chemical-mechanical polishing (CMP), such that the upper surface of field oxide 45 is substantially co-planar with the upper surface of n-well 42.

Gate oxide 46 is then thermally grown over the upper surface of the resulting structure. In the described embodiment, gate oxide 46 is silicon oxide having a thickness in the range of about 1.5 to 6.0 nm. However, this thickness can vary depending on the process being used.

A layer of polycrystalline silicon is deposited over the resulting structure. This polysilicon layer is then patterned to form polysilicon gate electrode 47. A P-implant mask (not shown) is then formed, and Boron diflouride ($BF_2$) is implanted at a dosage of about $1 \times 10^{14}/cm^2$ and an implant energy of about 15 KeV. Note that the Boron implantation is self-aligned with the edges of polysilicon gate electrode 47.

Figure 4B:
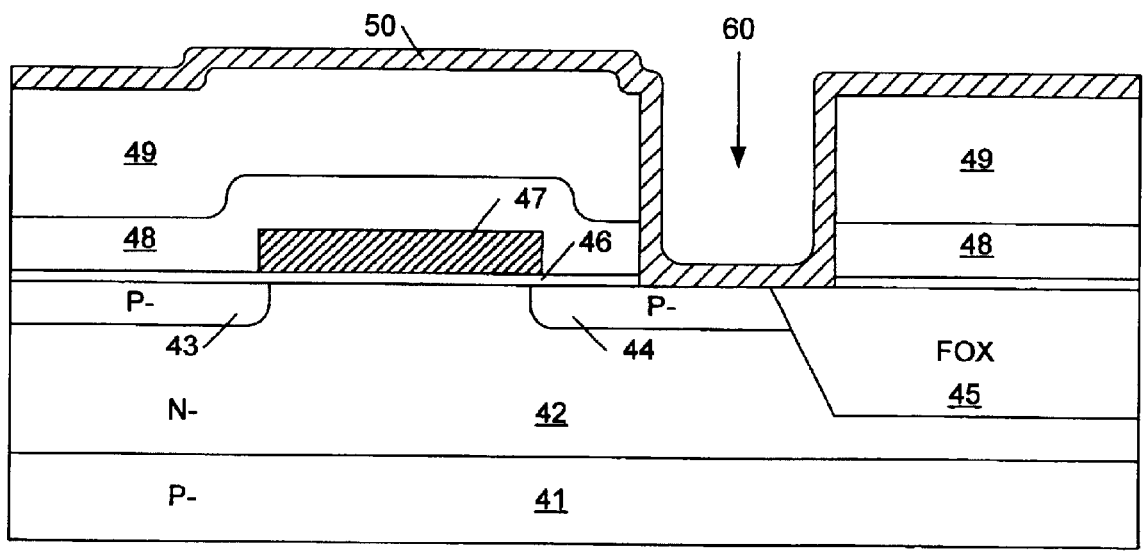

As illustrated in FIG. 4B, a layer of silicon nitride 48 is then deposited over the resulting structure. In the described embodiment, silicon nitride 48 is deposited to a thickness of about 150 nm using conventional processing techniques. In a particular embodiment, a thin layer (~20 nm) of oxide is provided under silicon nitride layer 48 to reduce stress. A thick layer of silicon oxide 49 is then deposited over silicon nitride layer 49. In the described embodiment, silicon oxide layer 49 has a thickness of about 1200 nm and is formed using conventional processing techniques.

An opening 60 is formed through silicon oxide layer 49, silicon nitride layer 48 and gate oxide 46. In the described embodiment, opening 60 has a cylindrical shape, with the cylinder having a diameter of about 250 nm. In other embodiments, opening 60 can have other shapes and sizes. Opening 60 is positioned to expose a portion of p-type source region 44.

Opening 60 is created by forming a photoresist mask (not shown) over silicon oxide layer 49, and etching through an opening in the photoresist mask that defines the location and shape of opening 60.

The photoresist mask is stripped, and conductively doped polysilicon layer 50 is formed over the resulting structure. In the described embodiment, polysilicon layer 50 is formed by depositing a layer of polysilicon to a thickness of about 50 nm. Polysilicon layer 50 is then conductively doped by ion implanting a p-type impurity, such as boron diflouride ($BF_2$), into the polysilicon. Alternatively, polysilicon layer 50 can be doped in situ during deposition. Polysilicon layer 50 extends into opening 60 and contacts p-type source region 44 as illustrated.

Figure 4C:
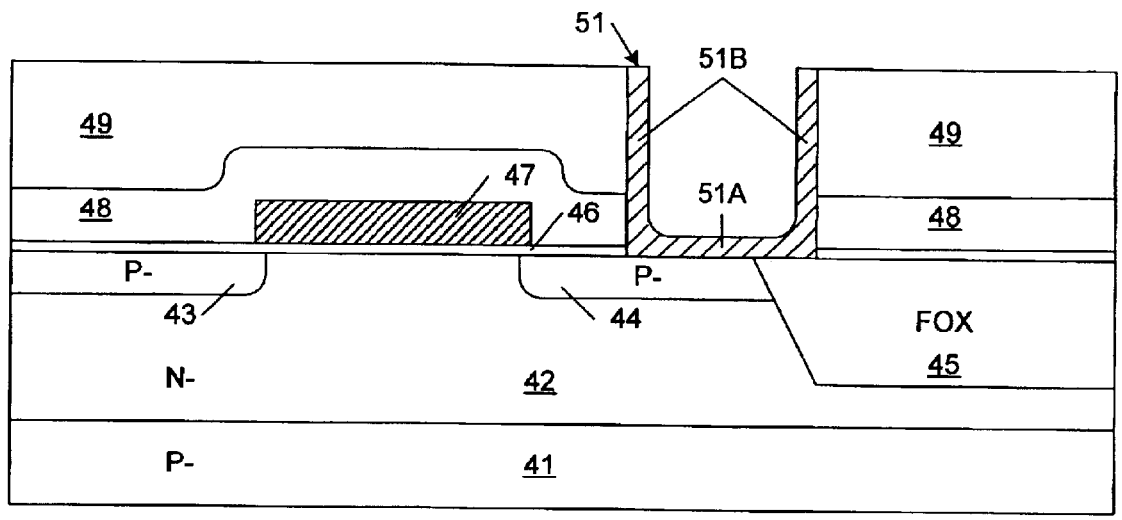

As illustrated in FIG. 4C, the upper surface of the resulting structure is planarized. In the described embodiment, a conventional chemical-mechanical polishing (CMP) process is used to perform this planarization step. In general, the planarization step removes the portion of polysilicon layer 50 that is not deposited in opening 60, as well as an upper portion of silicon oxide layer 49. After the planarization step has been performed, a polysilicon crown 51 remains in opening 60. Polysilicon crown 51 includes a substantially planar base region 51A that contacts p-type source region 44 (and field oxide 45). Polysilicon crown 51 also includes vertical walls 51B that extend vertically upward from base region 51A.

Figure 4D:
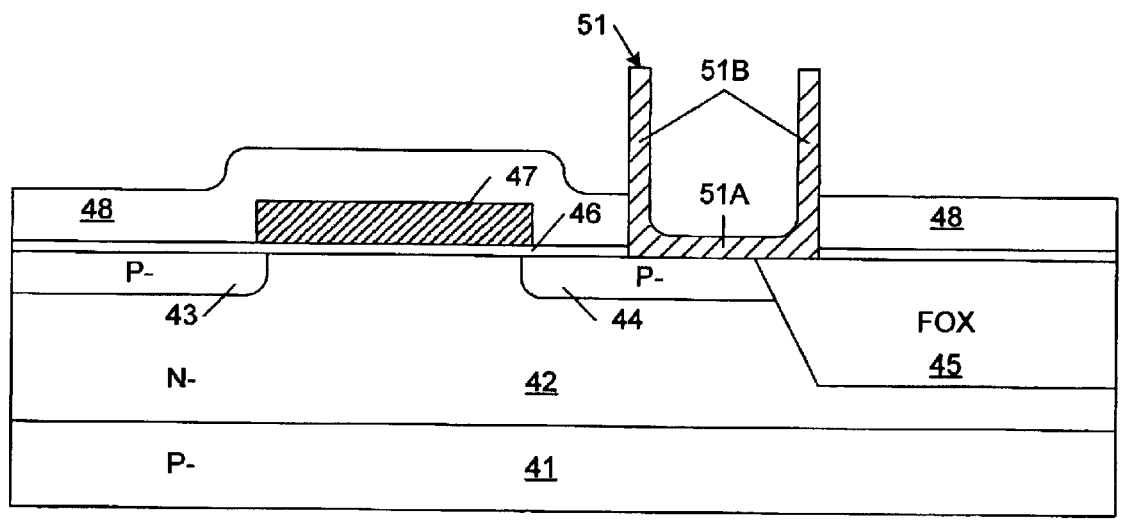

As illustrated in FIG. 4D, oxide layer 49 is then removed using an etchant that removes silicon oxide much faster than silicon nitride. This etch step is timed, such that the etchant removes silicon oxide layer 49 without significantly removing silicon nitride layer 48. In the described embodiment, this etchant is buffered or unbuffered hydrofluoric acid. After silicon oxide layer 49 has been removed, polysilicon crown 51 remains, with vertical walls 51B rising above silicon nitride layer 48. In the described embodiment, the walls 51B of polysilicon crown 51 extend about 800 nm above silicon nitride layer 48.

Figure 4E:
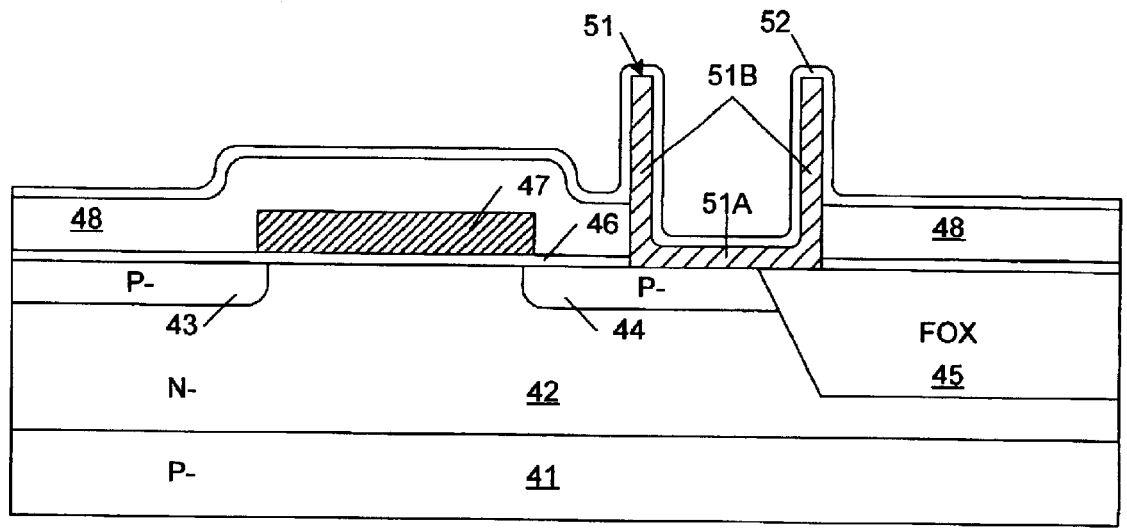

As illustrated in FIG. 4E, an oxide-nitride-oxide (ONO) structure 52 is formed over polysilicon crown 51. This ONO structure 52 is formed by depositing a first silicon oxide layer, a silicon nitride layer, and then a second silicon oxide layer. In the described embodiment, the first silicon oxide layer has a thickness of about 2 nm, the silicon nitride layer has a thickness of about 7 nm, and the second silicon oxide layer has a thickness of about 2 nm. These layers are deposited using well known processing techniques. Relatively high thermal cycles are required to form the various layers of ONO structure 52. For example, a total thermal cycle in the range of 850–950° C. for 20–60 minutes is required to form ONO structure 52. As understood by one of ordinary skill in the art, thermal cycles are a function of both temperature and time.

Figure 4F:
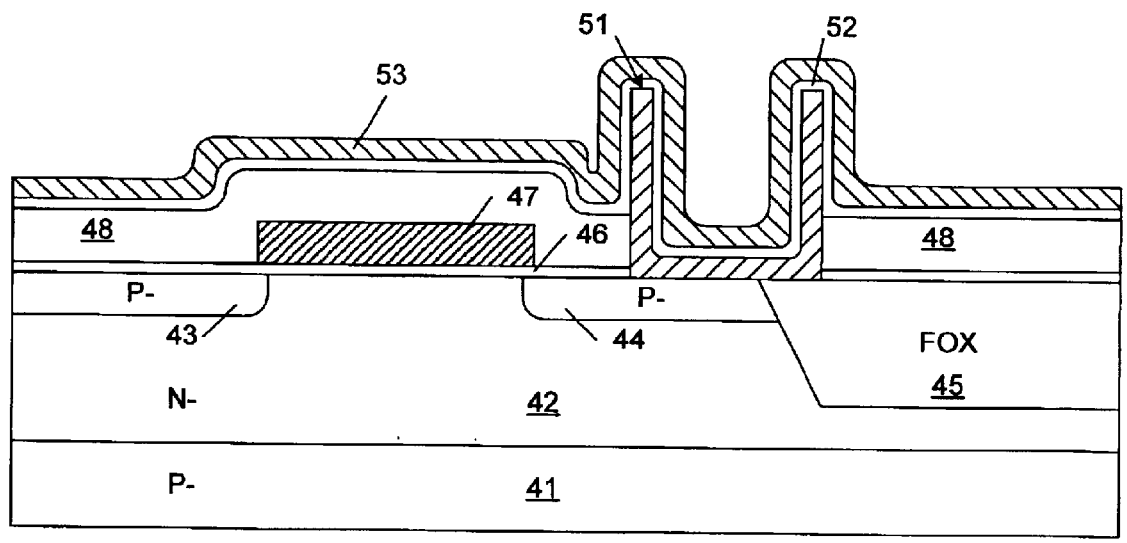

As illustrated in FIG. 4F, a conductively doped layer of polysilicon 53 is formed over ONO structure 52. In the described embodiment, polysilicon layer 53 is deposited to a thickness of about 150 nm. Polysilicon layer 53 is then conductively doped by ion implanting a p-type impurity, such as boron, into the polysilicon. Alternatively, polysilicon layer 53 can be doped in situ during deposition.

Figure 4G:
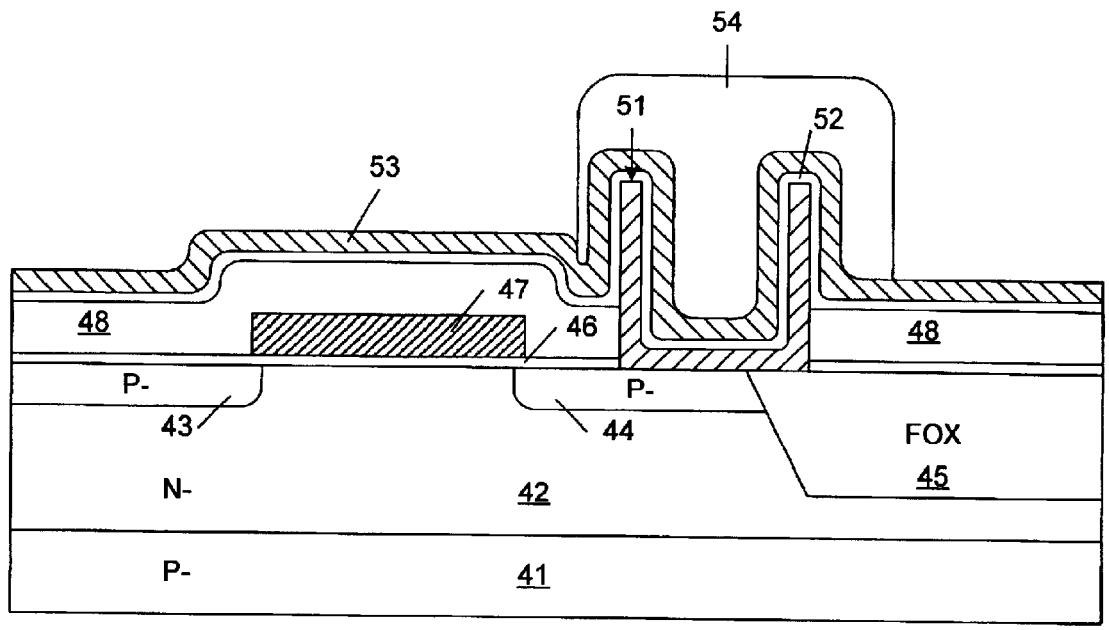
Figure 4H:
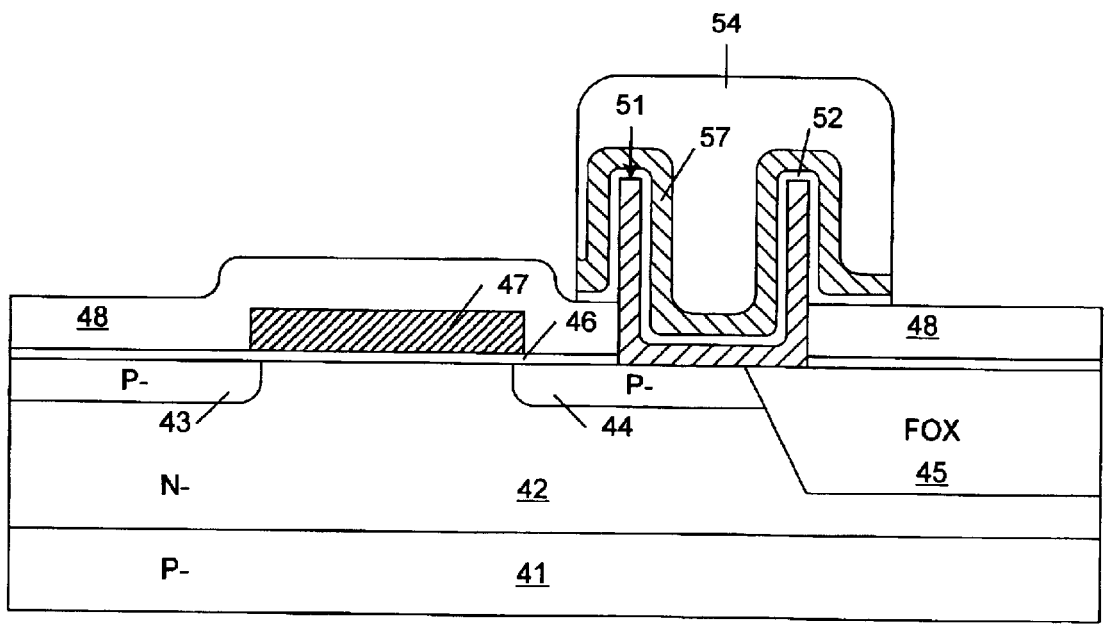

Turning now to FIG. 4G, a photoresist mask 54 is formed over polysilicon layer 53 as illustrated. Photoresist mask 54 is located over polysilicon crown 51 and the immediately adjacent area. As illustrated in FIG. 4H, a series of etches are performed to remove the exposed portions of polysilicon layer 53 and ONO layer 52. The remaining portion of polysilicon layer 53 forms a polysilicon plate structure 57.

Photoresist mask 54 is then removed, and a thermal cycle is performed to anneal polysilicon layers 51 and 53. During this step, the thermal cycle typically uses rapid thermal annealing (RTA) at relatively high temperatures of 950–1050° C. for 30 to 90 seconds. By performing these high thermal cycles prior to the formation of P+ and N+ shallow junctions and prior to the formation of salicide structures, these high thermal cycles advantageously do not significantly affect these subsequently performed processes.

Figure 4I:
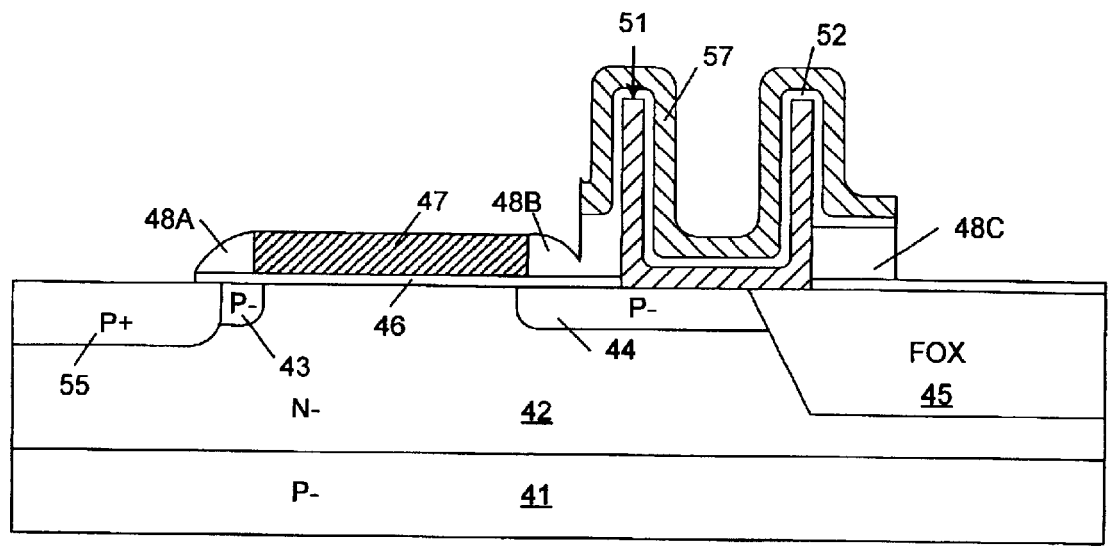

As illustrated in FIG. 4I, an anisotropic etch is performed on silicon nitride layer 48 using conventional processing techniques. After the anisotropic etch is complete, silicon nitride regions 48A–48C remain. Silicon nitride region 48A forms a sidewall spacer at one edge of polysilicon gate 47. Silicon nitride region 48B forms a sidewall spacer at the opposing edge of polysilicon gate 47. Silicon nitride region 48B extends to the capacitor structure formed by polysilicon crown 51, ONO structure 52 and polysilicon plate 53. Silicon nitride region 48C joins with silicon nitride region 48B outside the plane of FIG. 4I, thereby laterally surrounding polysilicon crown 51.

After silicon nitride regions 48A–48C have been formed, a P+ photoresist mask (not shown) is formed to define the locations of the desired P+ regions on the chip. A P+ type ion implant is then performed, thereby forming shallow P+ drain region 55 (as well as the other desired P+ regions on the substrate). Note that P+ drain region 55 is aligned with the edge of sidewall spacer 48A. In the described embodiment, the P+ ion implant is performed at a dosage of $5 \times 10^{15}/cm^2$ and an energy of less than 15 KeV. A short annealing thermal cycle is typically performed using RTA at 850 to 950° C. for 10 to 15 seconds.

Figure 4J:
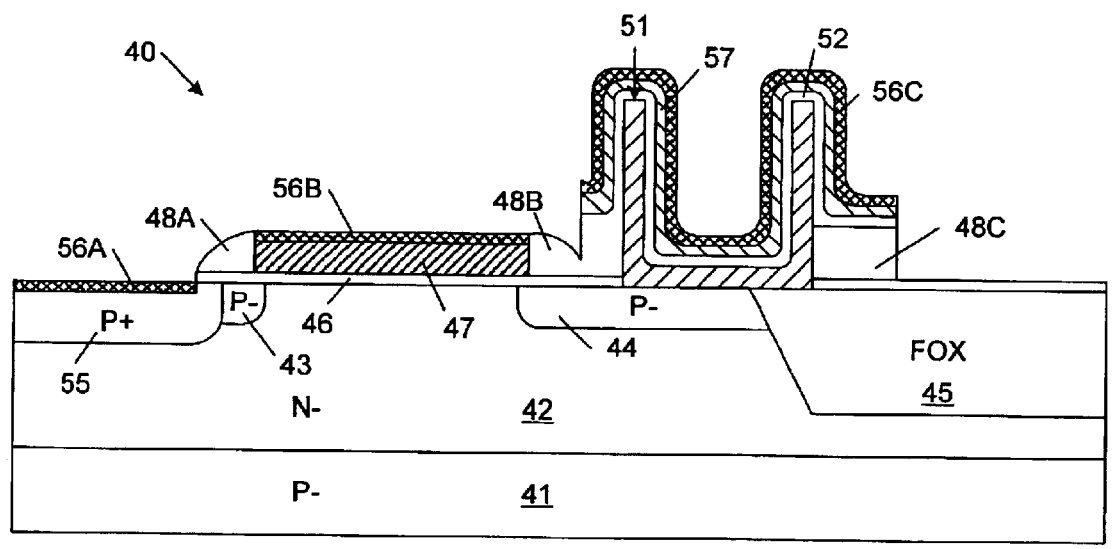

Turning now to FIG. 4J, a layer of refractory metal, such as titanium or cobalt, is blanket deposited over the resulting structure. In the described embodiment, titanium is deposited to a thickness of about 30 nm. An anneal step is then performed to form the titanium silicide at locations where the titanium contacts silicon. More specifically, the titanium is reacted over P+ region 55, thereby forming titanium salicide region 56A. The titanium is also reacted over polysilicon gate 47, thereby forming titanium salicide region 56B. Finally, the titanium is reacted over polysilicon plate 53, thereby forming titanium salicide region 56C. This anneal also further activates the P+ ions in P+ region 55. In the described embodiment, this thermal cycle is usually performed using RTA at 850 to 950° C. for 10 to 30 seconds. Note that the thermal cycles performed during the formation of the capacitor structure (i.e., 850–950° C. for 20–60 minutes; 950–1050° C. for 30 to 90 seconds) are greater than the thermal cycles performed during the formation of shallow drain region 55 and metal salicide regions 56A–56C (i.e., 850 to 950° C. for 10 to 15 seconds; 850 to 950° C. for 10 to 30 seconds). In accordance with one embodiment of the present invention, the thermal cycles performed during the formation of the shallow drain region 55 and the metal salicide regions 56A–56C are comparable or less than the thermal cycles performed during the formation of the capacitor structure.

An etch is then performed, thereby removing all unreacted portions of the titanium layer (e.g., those portions located of the titanium layer located over silicon nitride regions 48A–48B and field oxide 45).

The resulting DRAM cell 40 is illustrated in FIG. 4J. The access transistor of DRAM cell 40 is formed by drain regions 43 and 55, source region 44, salicide regions 56A–56B, nitride spacers 48A–48B, polysilicon gate electrode 47 and n-well 42. The capacitor structure of DRAM cell 40 is formed by polysilicon crown 51, ONO structure 52, polysilicon plate 57, and salicide region 56C. This capacitor structure has a relatively large surface area between polysilicon crown 51 and polysilicon plate 57, because plate 57 extends over both the interior and exterior surfaces of walls 51B, as well as over base region 51A. This relatively large surface area results in a relatively large capacitance for the capacitor structure. In addition, because the capacitor structure is formed in a vertical manner, the capacitor consumes a relatively small layout area.

In a conventional logic process, the ability to form good N+ and P+ shallow junctions and salicide is predicated on having minimum thermal cycles after the N+ and P+ implantation and the salicide deposition. By forming the capacitor structure, which typically uses higher thermal cycles, prior to the N+ and P+ implantation and salicide formation, the additional thermal cycles introduced by the formation of the capacitor structure will have minimum effects on the characteristics of transistors fabricated after the capacitor structure.

DRAM cell 40 is biased in substantially the same manner as DRAM cell 300 (FIGS. 3A–3D). Thus, salicide region 56A is connected to bit line 305, salicide region 56B is connected to word line 303, and n-well 42 is coupled to the $V_{ppl}$ voltage supply terminal. Salicide region 56C can be connected to any voltage between $V_{dd}$ and $V_{SS}$ to maximize the capacitance of the capacitor structure. Note that the connection to n-well 42 is formed outside the view of FIG. 4J.

FIGS. 4K–4V are cross sectional views of a DRAM cell 400 in accordance with another embodiment of the present invention during various stages of fabrication. In general, DRAM cell 400 includes a capacitor structure, which is formed using two more polysilicon layers than a conventional logic process. These additional polysilicon layers are formed prior to the formation of the polysilicon gate electrode of the access transistor.

Figure 4K:
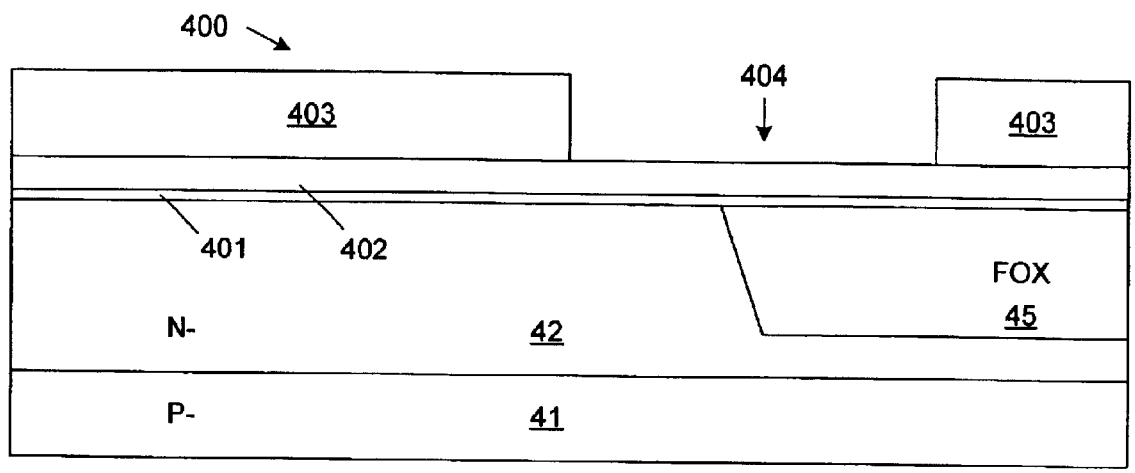
FIGS. 4K–4V are cross sectional views of a DRAM cell in accordance with another embodiment of the present invention during various stages of fabrication.

As illustrated in FIG. 4K, an n-type well region 42 and field oxide 45 is formed in a p-type monocrystalline silicon substrate 41. These elements have been described in detail above in connection with FIG. 4A. In the described embodiment, field oxide 45 has a depth in the range of about 250–400 nm. Thin oxide layer 401 is thermally grown over the upper surface of the resulting structure. In the described embodiment, thin oxide layer 401 is silicon oxide having a thickness in the range of about 5 to 10 nm. However, this thickness can vary depending on the process being used. A layer of silicon nitride 402 is deposited over thin oxide layer 401. In the described example, silicon nitride layer 402 has a thickness in the range of about 50 to 300 nm. A photoresist layer 403 is then deposited over the resulting structure. Photoresist layer 403 is exposed and developed, thereby creating opening 404. As described in more detail below, opening 404 defines a recessed storage area that will contain a crown electrode and a buried contact region of the DRAM cell.

Figure 4L:
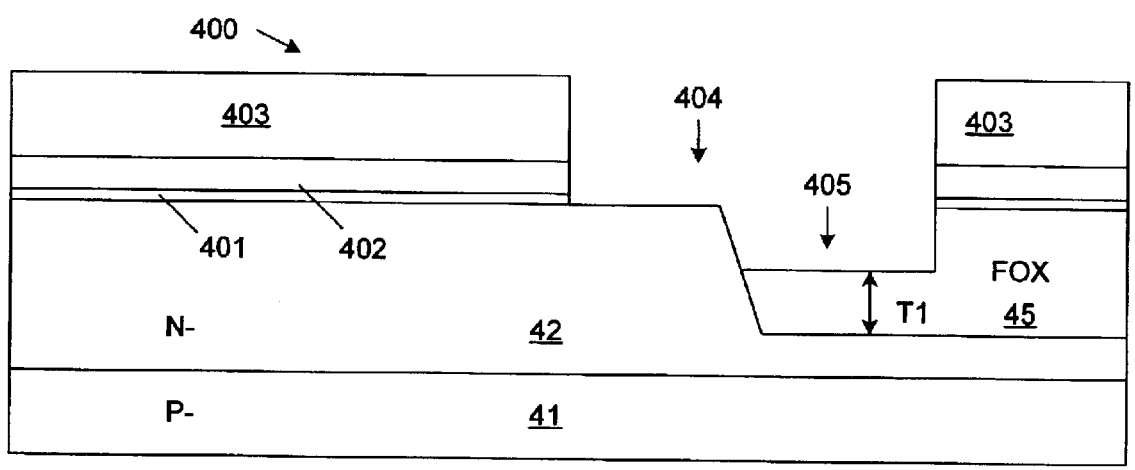

As illustrated in FIG. 4L, silicon nitride layer 402 and thin oxide layer 401 are etched through opening 404, thereby removing the exposed portions of these layers 401–402. The etch also removes an exposed portion of field oxide, thereby creating a cavity 405 in field oxide 45. At the end of the etch, field oxide 45 has a thickness T1 under cavity 405 in the range of about 50 to 200 nm. The etchant is highly selective to silicon, such that n-type well 42 is not substantially removed during the etch. In one embodiment, this etch is a timed etch.

Figure 4M:
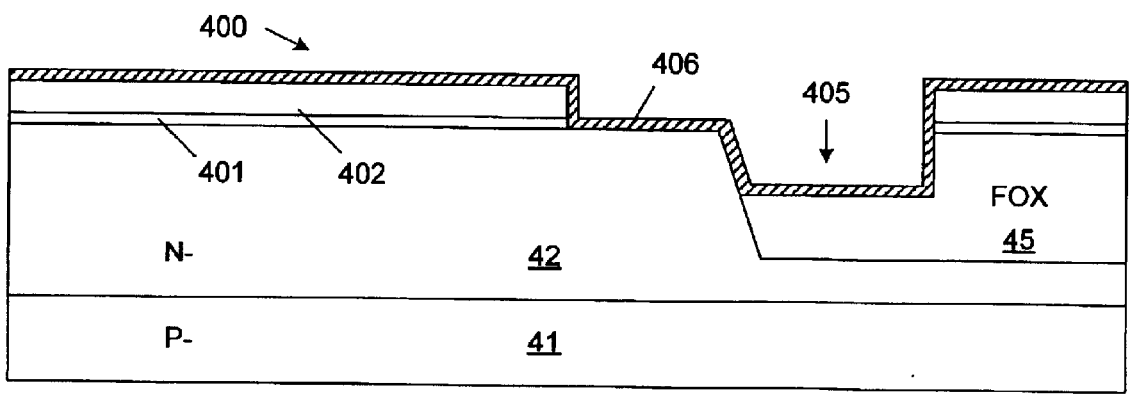

As illustrated by FIG. 4M, photoresist layer 403 is stripped, and a layer of polycrystalline silicon 406 having a thickness in the range of about 20 to 40 nm is deposited over the resulting structure. Polysilicon layer 406 extends into cavity 405, and contacts the exposed portion of n-type silicon region 42.

Figure 4N:
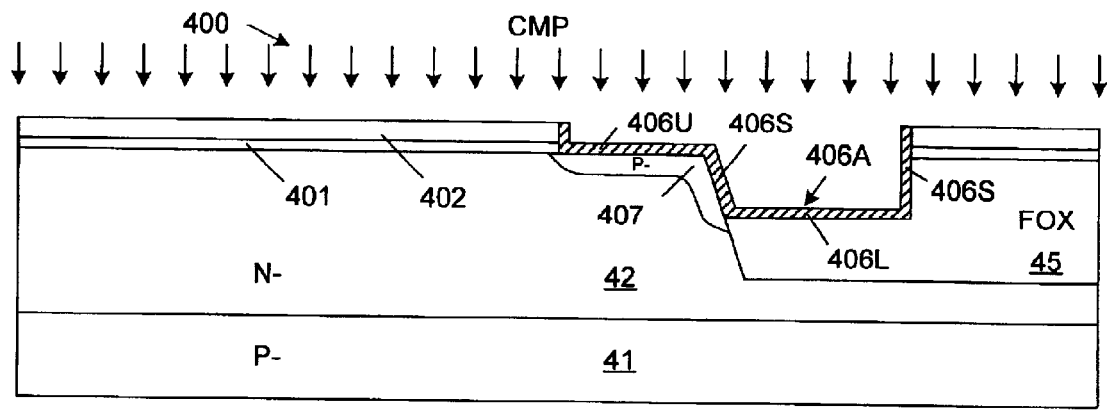

As illustrated by FIG. 4N, a chemical-mechanical polishing (CMP) polishing step is performed to remove the portions of polysilicon layer 406 located over silicon nitride layer 402. As a result, a recessed crown electrode 406A is formed. Crown electrode 406A has a lower base portion 406L located along the bottom of cavity 405, sidewalls 406S that extend along the sidewalls of cavity, and an upper base portion 406U that extends over the upper surface of the silicon substrate 42. Polysilicon layer 406 can be doped and annealed either before or after the CMP process is performed. In one embodiment, polysilicon layer 406 is doped by implanting a p-type impurity, such as boron, into the polysilicon. Polysilicon layer 406 is subsequently subjected to a RTA (rapid thermal anneal) at a temperature of 950–1050° C. for a duration of 20–60 seconds. Out-diffusion of the doped polysilicon layer 406 occurs during the annealing step, thereby forming a p-type contact region 407 in n-well 42, immediately adjacent to crown electrode 406A.

Figure 4O:
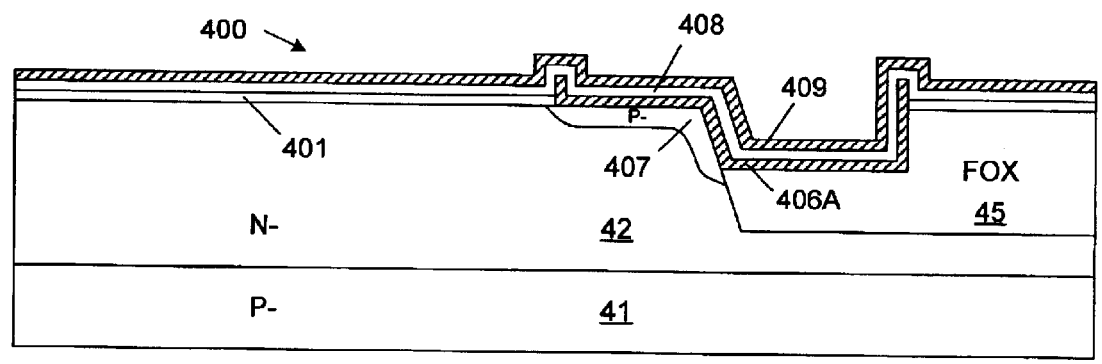

As illustrated in FIG. 4O, the remaining portion of silicon nitride layer 402 is stripped, and a capacitor dielectric layer 408 is deposited over the resulting structure. In the described embodiment, capacitor dielectric layer 408 is a nitride layer having a thickness in the range of about 5 to 8 nm. After being deposited, dielectric layer 408 is oxidized and annealed with a total thermal cycle in the range of 800–900° C. for 20 to 60 minutes. A second conductively doped polysilicon layer 409 is deposited over dielectric layer 408. In the described embodiment, polysilicon layer 409 has a thickness in the range of about 30 to 50 nm.

Figure 4P:
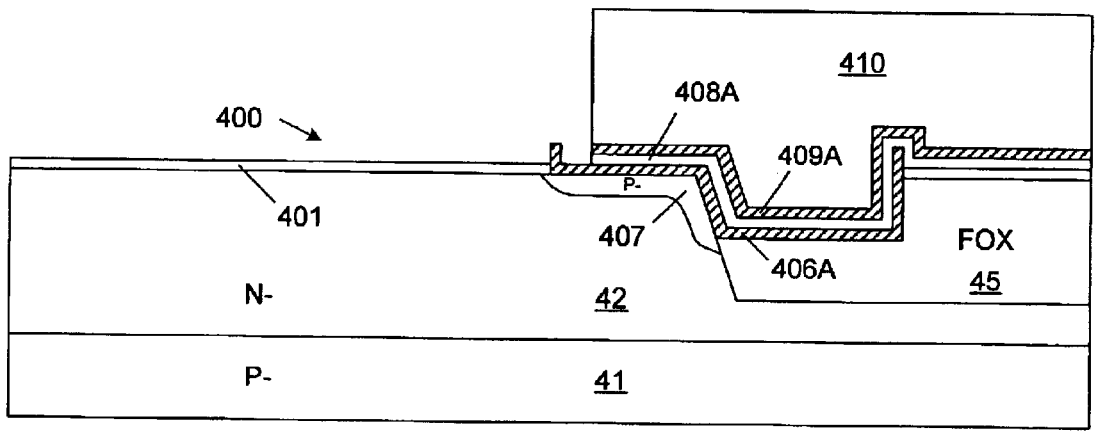

As illustrated in FIG. 4P, a layer of photoresist is deposited, exposed and developed, thereby forming photoresist mask 410. The upper polysilicon layer 409 and dielectric layer 408 are etched through this mask 410, thereby forming plate electrode 409A and capacitor dielectric 408A.

Figure 4Q:
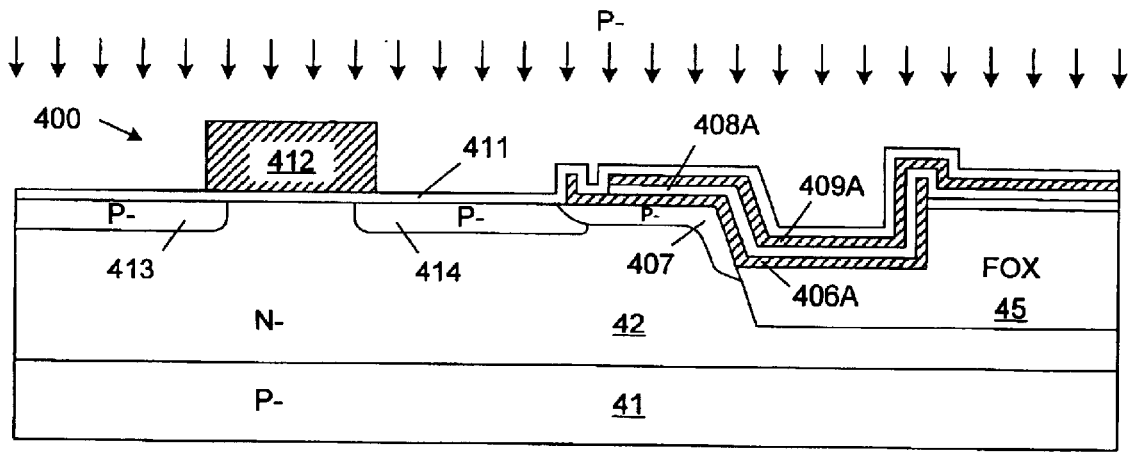

As illustrated in FIG. 4Q, photoresist mask 410 is stripped and thin oxide layer 401 is subsequently removed. At this time, standard logic process steps are resumed. Thus, a gate dielectric layer 411 is grown by thermally oxidizing the exposed silicon surfaces. Note that dielectric layer 411 extends over the exposed surfaces of crown electrode 406A and plate electrode 409A. A conductively doped polysilicon gate electrode 412 having a thickness in the range of about 100 to 250 nm is then formed over gate dielectric layer 411. A p-type ion implant step is then performed, thereby forming lightly-doped drain and source regions 413 and 414, respectively.

Figure 4R:
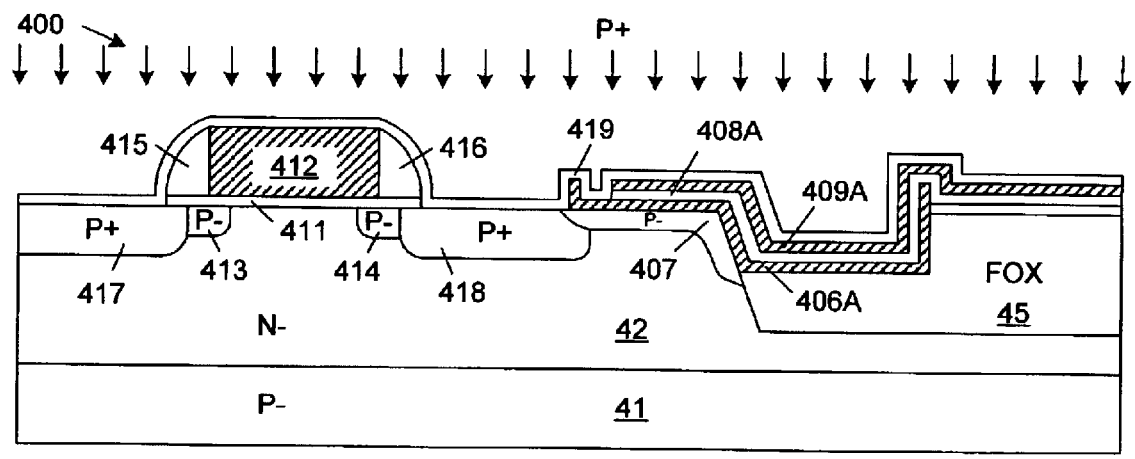

As illustrated in FIG. 4R, sidewall spacers 415 and 416 are formed using conventional logic process steps. During the formation of sidewall spacers 415–416, gate dielectric layer 411 is removed from locations not protected by gate electrode 412 and spacers 415–416. A p+ type ion implant is performed, thereby forming heavily-doped drain and source regions 417 and 418, respectively. Note that lightly doped source region 414 and heavily doped source region 418 are continuous with buried contact layer 407. As a result, the source of the access transistor is electrically coupled with crown electrode 406A.

In an alternate embodiment, p– type region 414 is blocked during the p+ type ion implant, so that p+ type region 418 is not formed. In this embodiment, the junction breakdown voltage of the resulting structure is improved. Because P+ and N+ implants are performed separately, with different photoresist masks in a standard CMOS process, no additional masking steps are required to block p– type region 414.

A dielectric layer 419 (e.g., silicon oxide) is then deposited over the resulting structure.

Figure 4S:
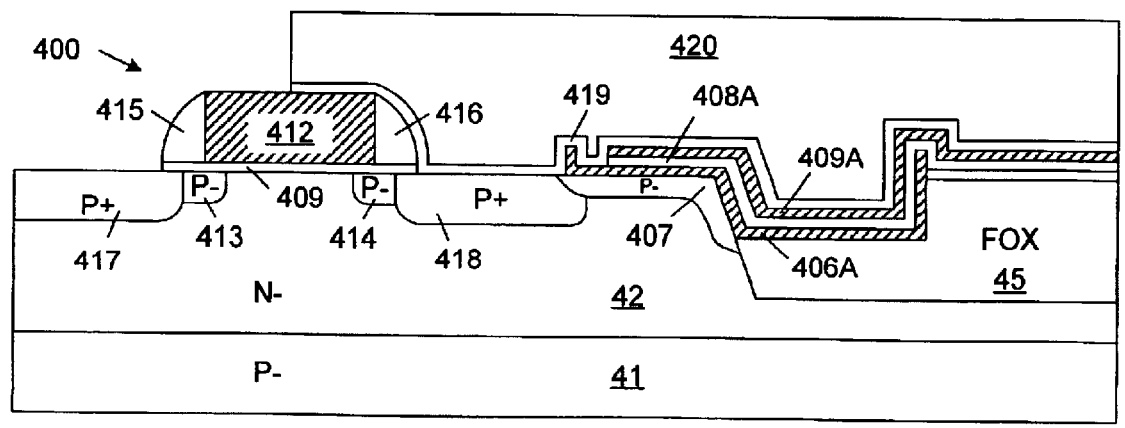

As illustrated in FIG. 4S, a salicide blocking photoresist mask 420 is formed over dielectric layer 419. Mask 420 is patterned to expose p+ type drain region 417 and a portion of gate electrode 412. Dielectric layer 419 is then etched, thereby removing the portions of dielectric layer 419 exposed by mask 420. More specifically, p+ drain region 417 and the left portion of polysilicon gate 412 are exposed. Salicide blocking mask 420 is typically used in a standard logic process to block out areas where salicide is not desired, such as I/O buffers and resistors. Thus, mask 420 is not an additional mask with respect to a standard logic process.

Figure 4T:
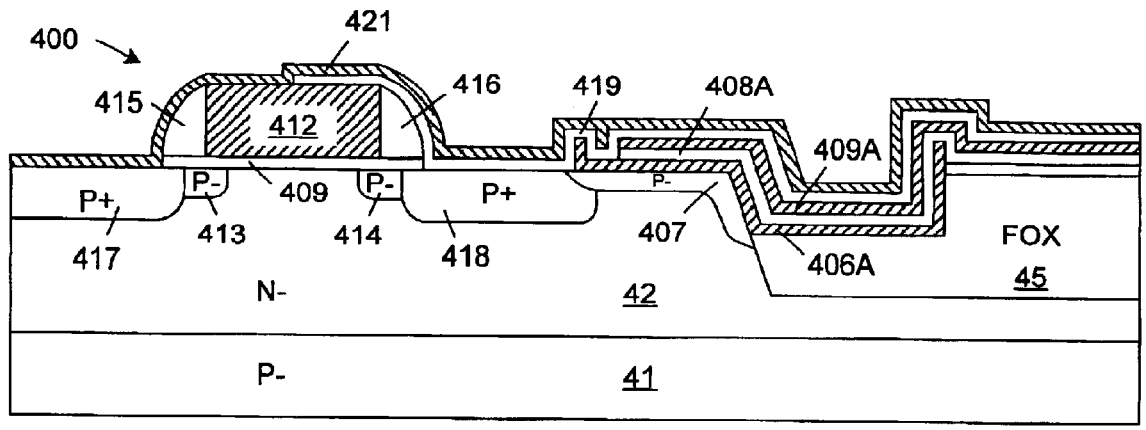

As illustrated in FIG. 4T, mask 420 is stripped and a refractory metal layer 421 is deposited over the resulting structure. An anneal is subsequently performed, thereby causing the refractory metal layer 421 to react with underlying silicon regions to form metal silicide regions. In FIG. 4T, the only silicon regions underlying refractory metal layer 421 are the p+ drain region 417 and the left portion of polysilicon gate electrode 412.

Figure 4U:
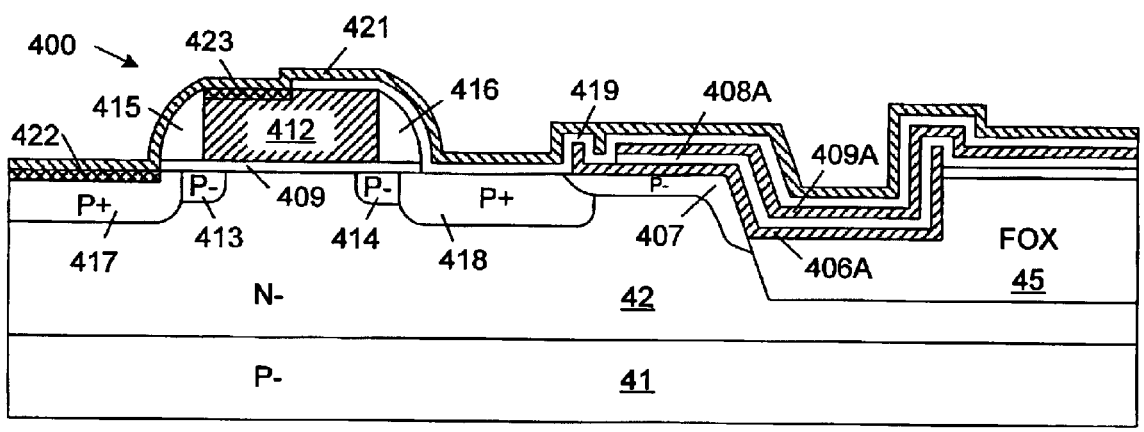
Figure 4V:
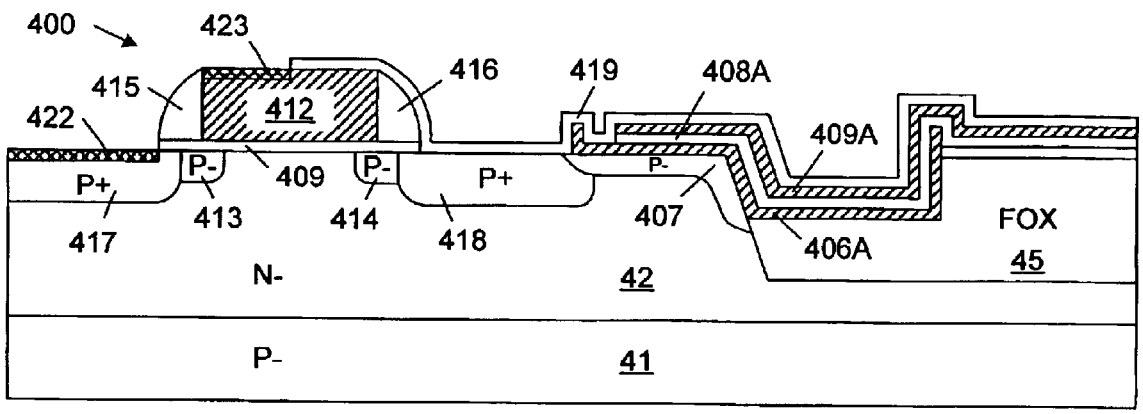

As illustrated in FIG. 4U, metal silicide regions 422 and 423 are formed over p+ drain region 417 and the left portion of polysilicon gate electrode 412. The unreacted portion of refractory metal layer 421 is then removed, as illustrated in FIG. 4V. Note that metal silicide region 423 is formed at least partially over gate electrode 412. It is preferable to block silicide formation from areas where leakage current should be minimized, namely, source region 418, crown electrode 406A and plate electrode 409A.). Note that dielectric layer 419 prevents silicide from being formed over crown electrode 406A or plate electrode 409A.

Two additional masks 403 and 410 and two additional polysilicon layers 406 and 409 are used to form a capacitor with a large three dimensional surface area and thereby higher capacitance with a smaller physical dimension. The temperature cycles associated with capacitor formation do not affect the subsequent N+ and P+ shallow junction and salicide formation. In addition, the internal node of the capacitor is preferably protected and substantially free of salicide formation for reduced leakage current.

Figure 4W:
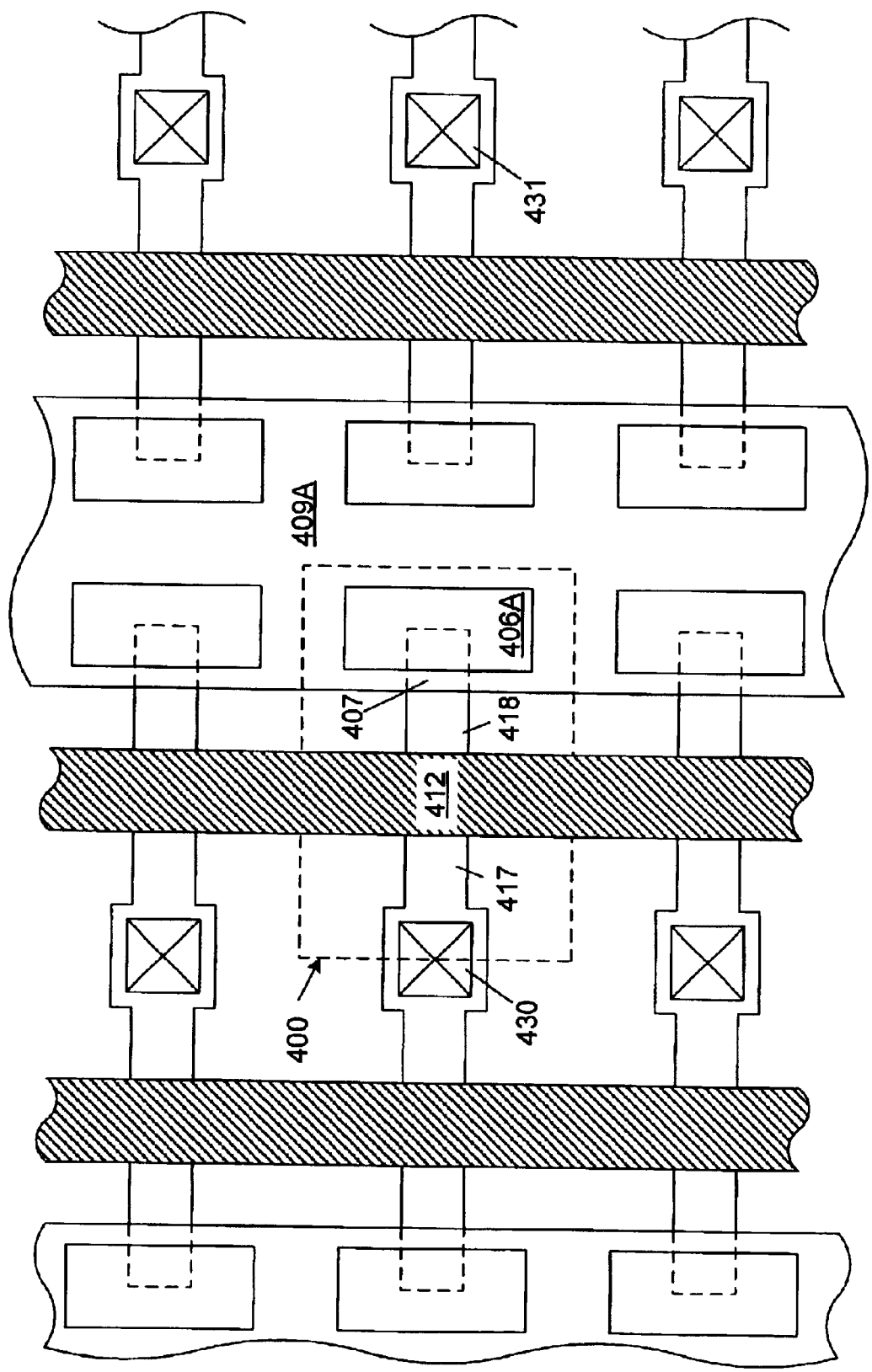
FIGS. 4W–4X are layout views of arrays containing the DRAM cell of FIG. 4V in accordance with various embodiments of the present invention.

FIG. 4W illustrates the layout of memory cell 400 in accordance with one embodiment of the present invention. Contacts, which provide connections between the drain of an access transistor and a bit line, are illustrated as boxes containing X's in FIG. 4W. Thus, contact 430 provides a connection from drain region 417 of DRAM cell 400 to bit line 305 (not shown, see, FIG. 3A). Contact 430 also provides a connection to the drain region of a symmetric DRAM cell located to the left of DRAM cell 400. In this manner, one contact provides a connection to two DRAM cells in an array.

Bit line 305 extends along the horizontal axis of FIG. 4W, such that bit line 305 is connected to both contacts 430 and 431. Other bit lines are coupled to other columns of DRAM cells in a similar manner.

The DRAM cell array is configured such that certain adjacent DRAM cells in adjacent rows share the same plate electrode. For example, DRAM cell 400 shares plate electrode 409A with five other DRAM cells in FIG. 4W. Plate electrode 409A extends along the vertical axis in FIG. 4W, in parallel with the word lines (e.g., gate 412). The capacitors of adjacent cells are electrically isolated through field oxide (FOX) region 45, e.g., at the minimum spacing allowed by the design rules. Plate electrode 409A is biased at the $V_{bbl}$ level to allow the maximum turn-on of the capacitor.

Figure 4X:
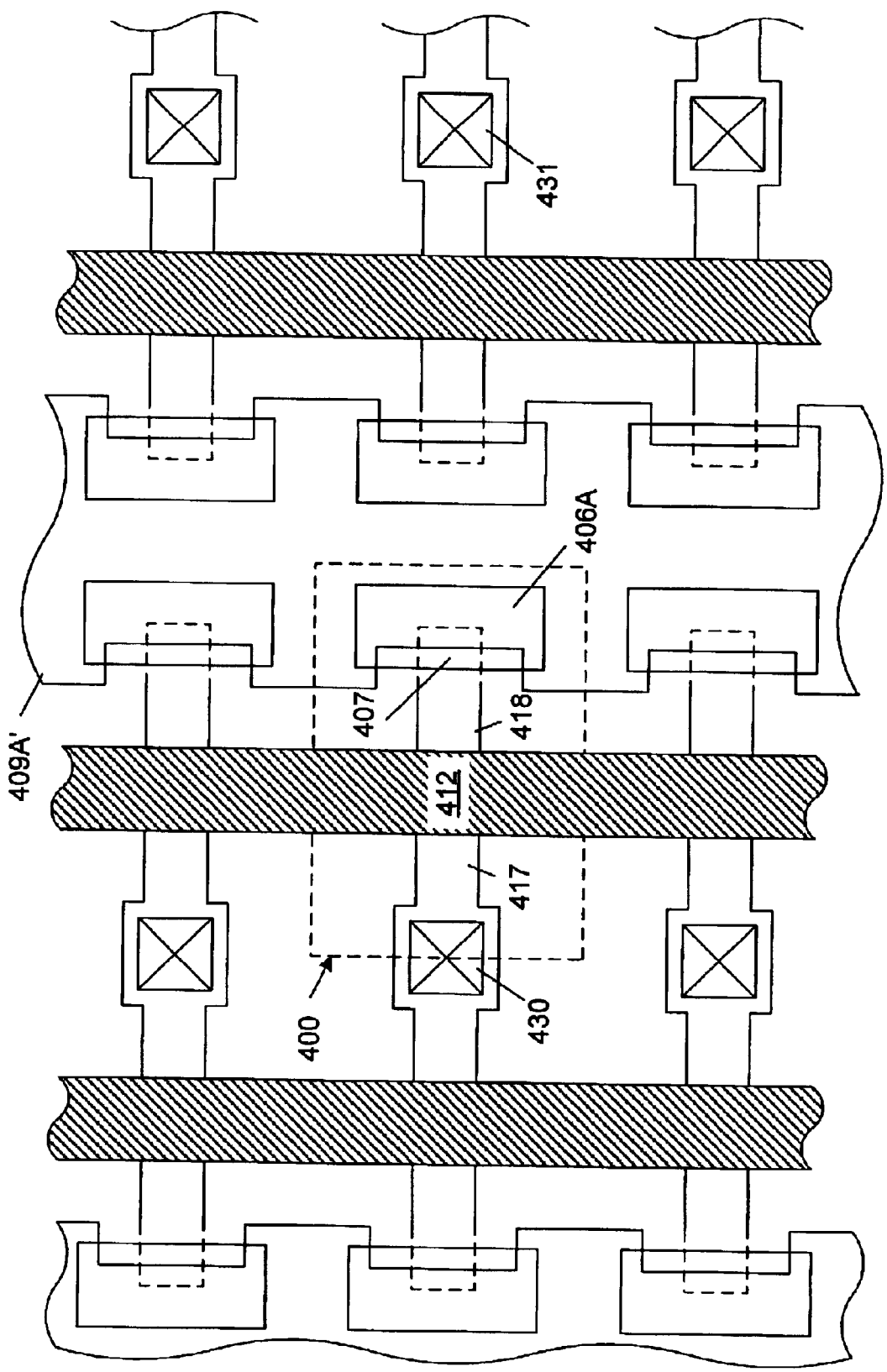

FIG. 4X illustrates the layout of memory cell 400 in accordance with another embodiment of the present invention. The layout of FIG. 4X is similar to the layout of FIG. 4W. However, plate electrode 409A' in FIG. 4X includes a series of notches to allow better electrical connection between crown electrode 406A and the source 418 of the access transistor.

In another embodiment, a single polysilicon layer can be used to create both the gate electrode and the plate electrode of the memory cell. Such an embodiment is illustrated in FIGS. 4Y–4Z.

Figure 4Y:
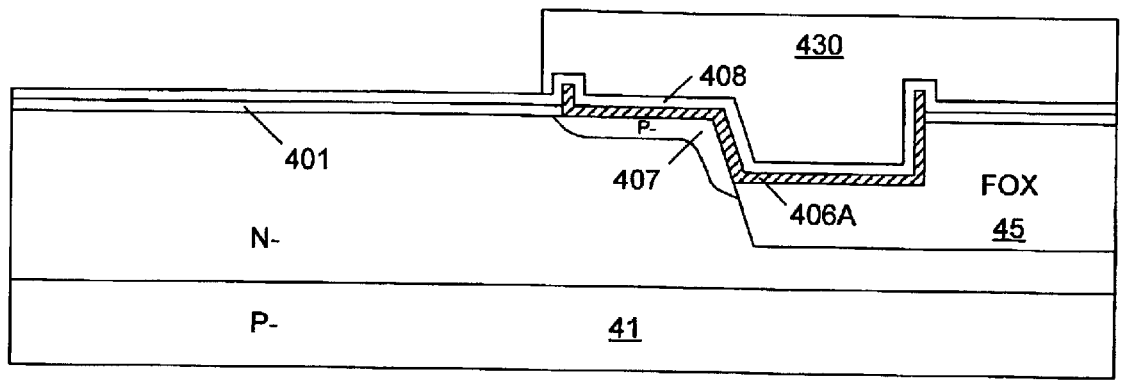

As illustrated in FIG. 4Y, a photoresist mask 430 is formed over dielectric layer 408 (before the plate electrode is deposited). Photoresist mask 430 covers crown electrode 406A. An etch is then performed, removing the exposed portions of dielectric layer 408 and thin oxide layer 401. At the end of this etch, the portion of n-type region 42 where the access transistor is to be formed is exposed. Mask 430 is then stripped.

Figure 4Z:
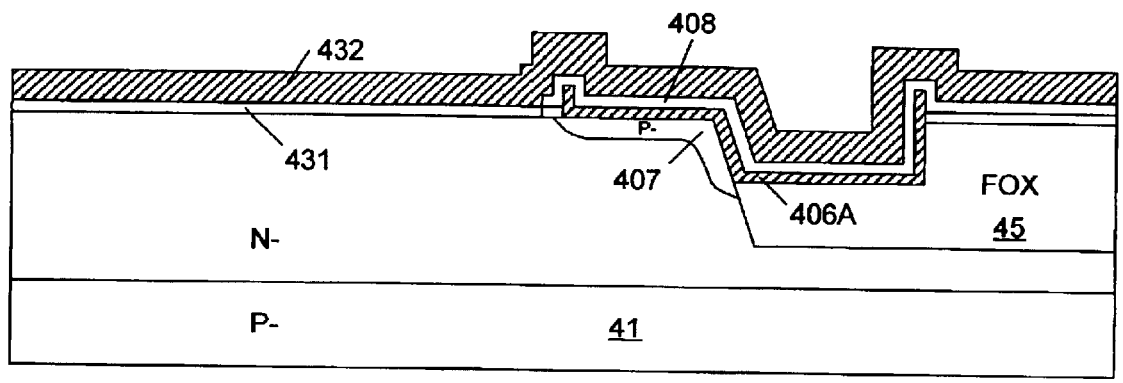
Figure 4A:
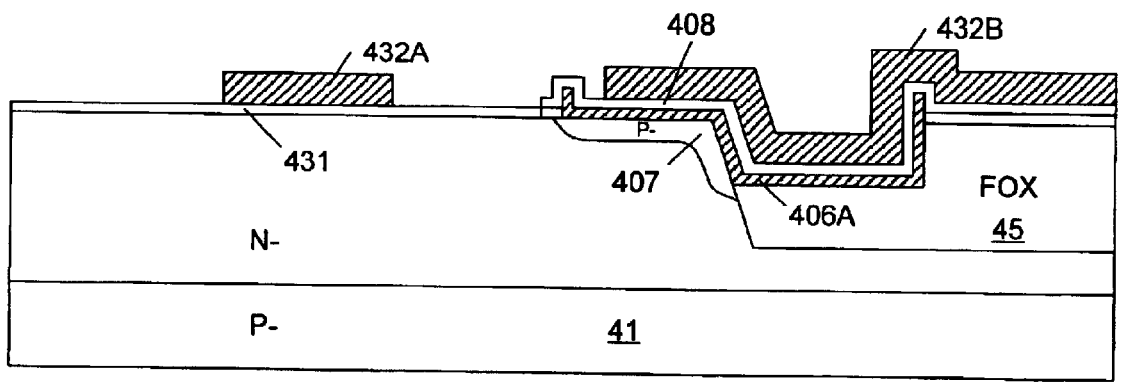

As illustrated in FIG. 4Z, gate dielectric layer 431 is then formed by thermal oxidation. This thermal oxidation does not substantially affect capacitor dielectric layer 408, which is formed of silicon nitride. A polysilicon layer 432 is subsequently deposited over the resulting structure.

As illustrated in FIG. 4AA, polysilicon layer 432 is patterned and etched to form the gate electrode 432A and capacitor plate electrode 432B. Processing then continues in accordance with FIGS. 4Q–4V. The advantage of this embodiment is a simplified process with only one additional masking step over a conventional logic process. The tradeoff is a slightly larger spacing between the plate electrode and the gate electrode (word line) because both are patterned from the same polysilicon layer.

Figure 5:
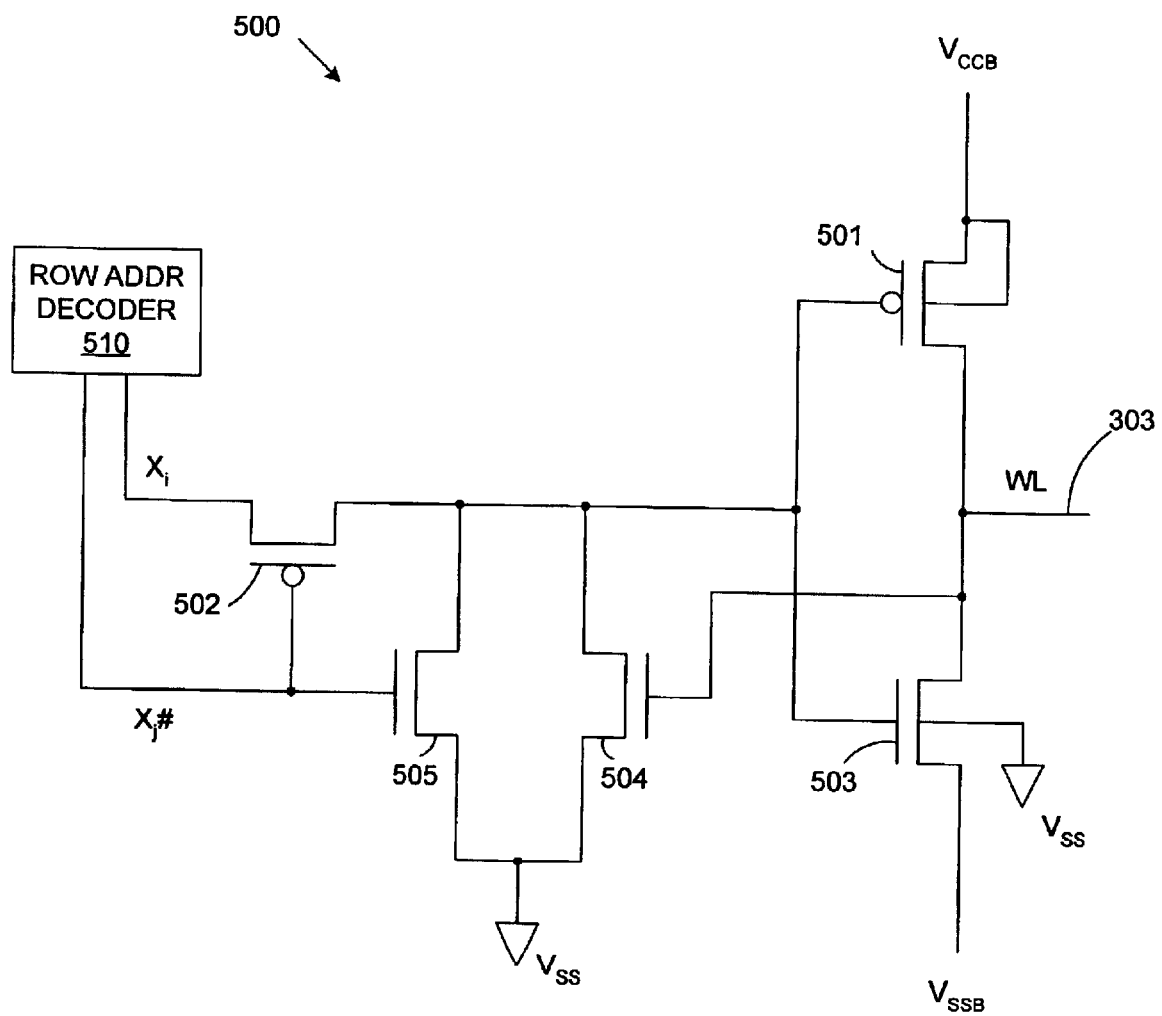
FIG. 5 is a schematic diagram of a word line driver in accordance with one embodiment of the present invention.

FIG. 5 is a schematic diagram of a word line driver 500 used to drive word line 303 (FIG. 3A), word line 47 (FIG. 4J), word line 412 (FIG. 4V) or word line 432A (FIG. 4AA) in accordance with one embodiment of the present invention. In the described embodiment, the output voltages supplied by word line driver 500 are provided to word line 303 (FIG. 3A). Word line driver 500 consists of P-channel transistors 501–502 and N-channel transistors 503–505. To deactivate word line 303, transistor 501 is turned on, thereby pulling word line 303 up to the positive boosted word line voltage $V_{CCB}$. The $V_{CCB}$ word line voltage is high enough to turn off access transistor 301. To activate word line 303, pull-down transistor 503 is turned on, thereby pulling down word line 303 to the $V_{SSB}$ voltage. The generation of the $V_{SSB}$ word line voltage is described in more detail below.

The gate of word line pull-up transistor 501 and the gate of word line pull-down transistor 503 are commonly connected to a pass gate formed by p-channel transistor 502. Transistor 502, when turned on, couples transistors 501 and 502 to receive an output signal $X_i$ provided by a row address decoder 510. The gate of transistor 502 is coupled to receive another output signal $X_j\#$ from row address decoder 510. When the memory cells connected to word line 303 are selected for access, row address decoder 510 first drives the $X_i$ signal high, and then drives the $X_j\#$ signal low. The low state of the $X_j\#$ signal turns on pass transistor 502, which provides the logic high $X_i$ signal to the gates of the pull up and pull down transistors 501 and 503. Under these conditions, pull down transistor 503 is turned on, thereby coupling word line 303 to receive the $V_{SSB}$ word line voltage.

As described in more detail below, row address decoder 510 controls a first subset of word lines that includes word line 303 and a plurality of other word lines. If word line 303 is not selected for access (but another word line in the first subset of word lines is selected for access), then row address decoder 510 provides logic low values for both the $X_i$ and $X_j\#$ signals. Under these conditions, the gates of pull up and pull down transistors 501 and 503 are maintained at logic low states by n-channel transistor 504. Note that the gate of transistor 504 is connected to word line 303, which is maintained at a logic high value when word line 303 is not being accessed. As a result, transistor 504 is turned on when word line 303 is not being accessed, thereby coupling the gates of transistors 501 and 503 to the $V_{SS}$ supply voltage. The $V_{SS}$ supply voltage turns on pull up transistor 501 and turns off pull down transistor 503, thereby maintaining a logic high voltage (i.e., $V_{CCB}$) on word line 303.

During the data retention state (i.e., when none of the word lines in the first subset of word lines is being accessed), row address decoder 510 drives the $X_j\#$ signal high, thereby turning on n-channel transistor 505. Turned on transistor 505 couples the gates of pull up and pull down transistors 501 and 503 to the $V_{SS}$ supply voltage. As a result, pull up transistor 501 is turned on and pull down transistor 503 is turned off. At this time, transistor 501 couples word line 303 to receive the $V_{CCB}$ voltage, thereby turning off access transistor 301 of memory cell 300 (or the access transistors of memory cell 40 or 400). Pull down transistor 503 is selected to be an n-channel transistor to speed up the turn on of word line 303. However, in the present embodiment, the bulk of all n-channel transistors formed are connected to receive the $V_{SS}$ supply voltage. (See, FIG. 3B, which illustrates p-type substrate 306 coupled to receive the $V_{SS}$ supply voltage). As a result, the minimum value of the $V_{SSB}$ control voltage is limited to one diode voltage drop below the $V_{SS}$ supply voltage (i.e., one diode voltage drop below ground). Moreover, each row of memory cells has an associated word line driver. There are usually numerous rows of memory cells (e.g., more than 100) in an embedded memory. As a result of the large number of word line drivers, the reverse junction leakage between the substrate and the sources of the n-channel pull down transistors (such as pull down transistor 503) can be quite substantial. The reverse junction leakage increases exponentially as the $V_{SSB}$ control voltage becomes more negative. To limit the reverse junction leakage, the word line drivers are divided into groups of 32, with each group being coupled to a common $V_{SSB}$ coupling circuit 700. As a result, the embedded memory is partitioned into small banks of 32 rows, as compared to 128–512 rows per bank in standard DRAM processes. This is advantageous because DRAM cells fabricated using a conventional logic process have cell capacitors that are necessarily much smaller (e.g., 3 to 10 femto-Farads) than cell capacitors in standard DRAM processes (e.g., 20 to 40 femto-Farads) to keep cell size small. The smaller bank size reduces the parasitics and noises proportionally during memory cell sensing operations. In one embodiment, each bank includes 64 or fewer rows. In another embodiment, each bank includes 32 or fewer rows. Note that these embodiments might include one or more additional redundant rows.

Figure 6:
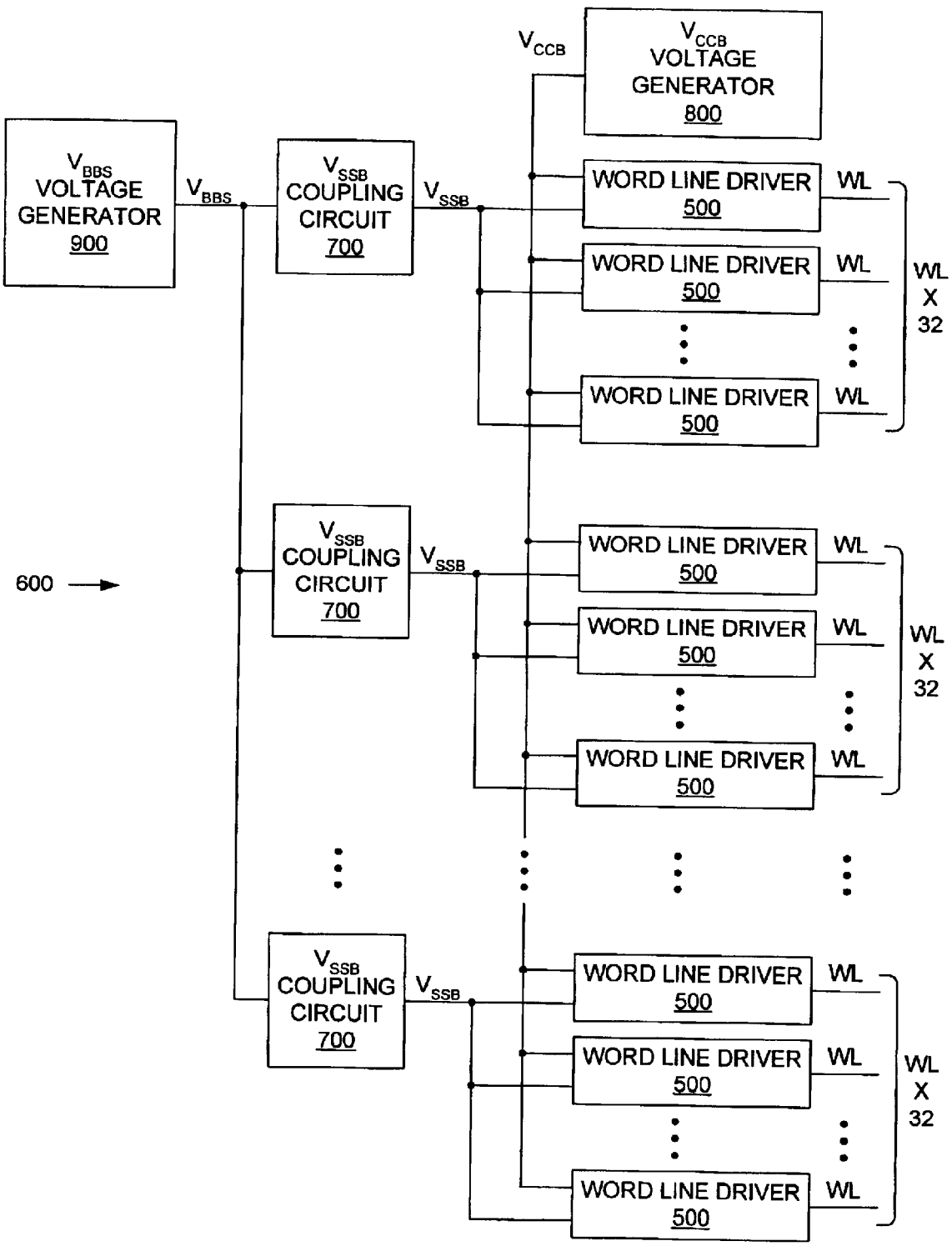
FIG. 6 is a block diagram illustrating a word line driver system that includes a first plurality of word line drivers, a second plurality of $V_{SSB}$ coupling circuits, a $V_{CCB}$ voltage generator and a $V_{BBS}$ voltage generator in accordance with one embodiment of the present invention.

FIG. 6 is a block diagram illustrating a word line driver system 600 that includes a first plurality of word line drivers 500, a second plurality of $V_{SSB}$ coupling circuits 700, a $V_{CCB}$ voltage generator 800 and a $V_{BBS}$ voltage generator 900. Each $V_{SSB}$ coupling circuit 700 is coupled to a corresponding group of 32 word line drivers 500. As described in more detail below, when one of the word lines in a group is to be turned on, the corresponding $V_{SSB}$ coupling circuit 700 is controlled to couple the $V_{BBS}$ voltage generator 900 to the corresponding group of 32 word line drivers. As a result, the $V_{SSB}$ coupling circuit routes the negative boosted voltage $V_{BBS}$ generated by the $V_{BBS}$ voltage generator 900 as the $V_{SSB}$ voltage. As described in more detail below, $V_{BBS}$ voltage generator 900 generates a $V_{BBS}$ voltage having a value less than one threshold voltage ($V_{tp}$) below the $V_{SS}$ supply voltage. The $V_{BBS}$ voltage is therefore greater than the $V_{SS}$ supply minus one diode voltage drop. When none of the word lines in a group is to be turned on, the corresponding $V_{SSB}$ coupling circuit 700 is controlled to couple the $V_{SS}$ voltage supply to the corresponding group of 32 word line drivers. That is, the $V_{SSB}$ coupling circuit 700 routes the $V_{SS}$ supply voltage as the $V_{SSB}$ voltage.

Because only a subset of the word line drivers 500 is coupled to receive the $V_{BBS}$ voltage at any given time, the reverse junction leakage is substantially reduced. Moreover, by limiting the $V_{BBS}$ voltage to a voltage less than one threshold voltage below the $V_{SS}$ supply voltage, the reverse junction leakage is further reduced.

Figure 7:
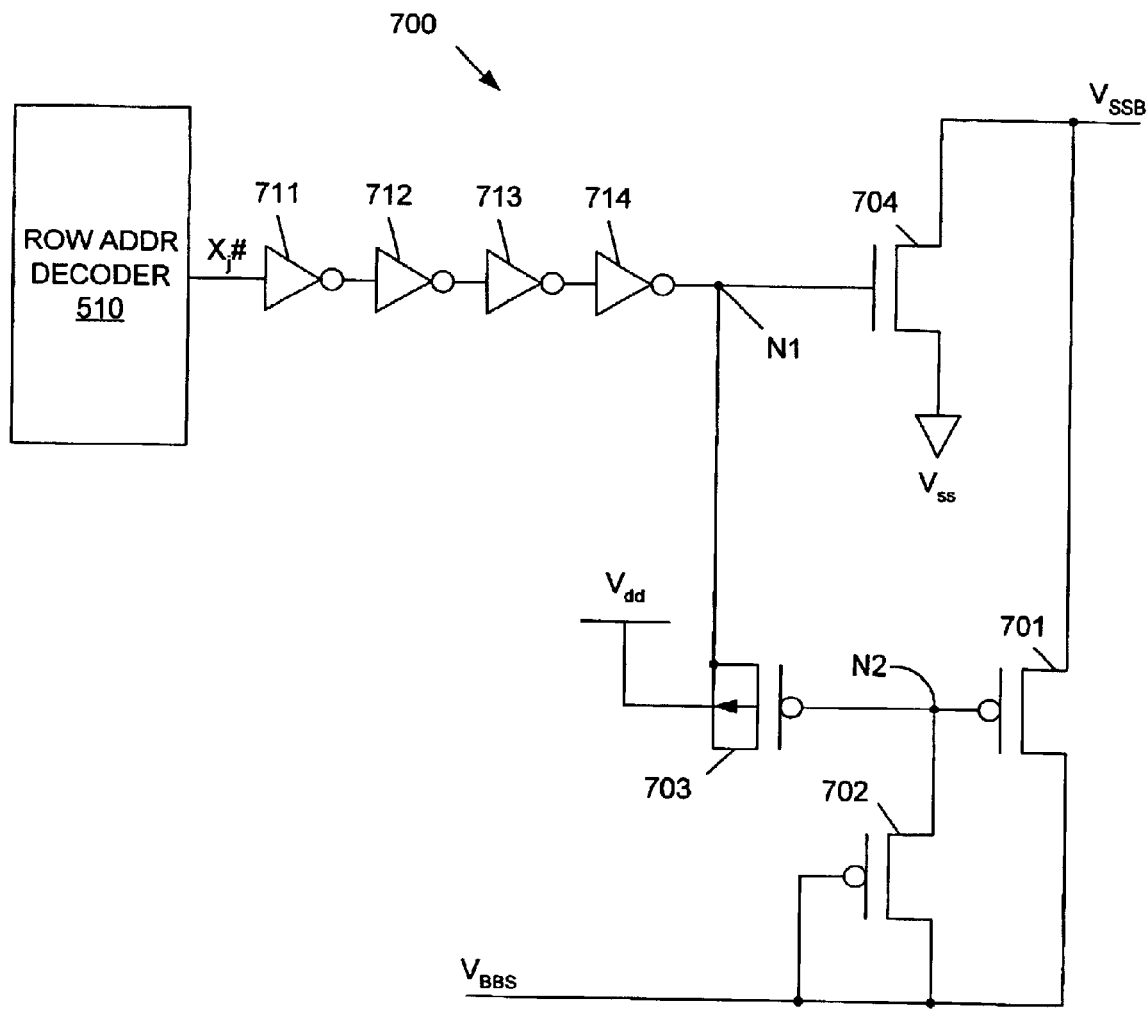
FIG. 7 is a schematic diagram of a $V_{SSB}$ coupling circuit in accordance with one embodiment of the present invention.

FIG. 7 is a schematic diagram of $V_{SSB}$ coupling circuit 700 in accordance with one embodiment of the present invention. $V_{SSB}$ coupling circuit 700 includes p-channel transistors 701–703, n-channel transistor 704 and inverters 711–714. P-channel transistor 701 is connected between the $V_{SSB}$ and $V_{BBS}$ voltage supply lines. The gate of transistor 701 is coupled to node N2. Transistor 702 is connected between node N2 and the $V_{BBS}$ voltage supply line. P-channel transistor 703 is connected as a capacitor, with its source and drain commonly connected to node N1, and its gate connected to node N2. N-channel transistor 704 is connected between the $V_{SSB}$ voltage supply line and the $V_{SS}$ voltage supply terminal. The gate of transistor 704 is connected to node N1. Inverters 711–714 are connected in series, with inverter 711 receiving the $X_j\#$ signal from row address decoder 510, and inverter 714 providing the delayed $X_j\#$ signal to node N1.

Figure 8:
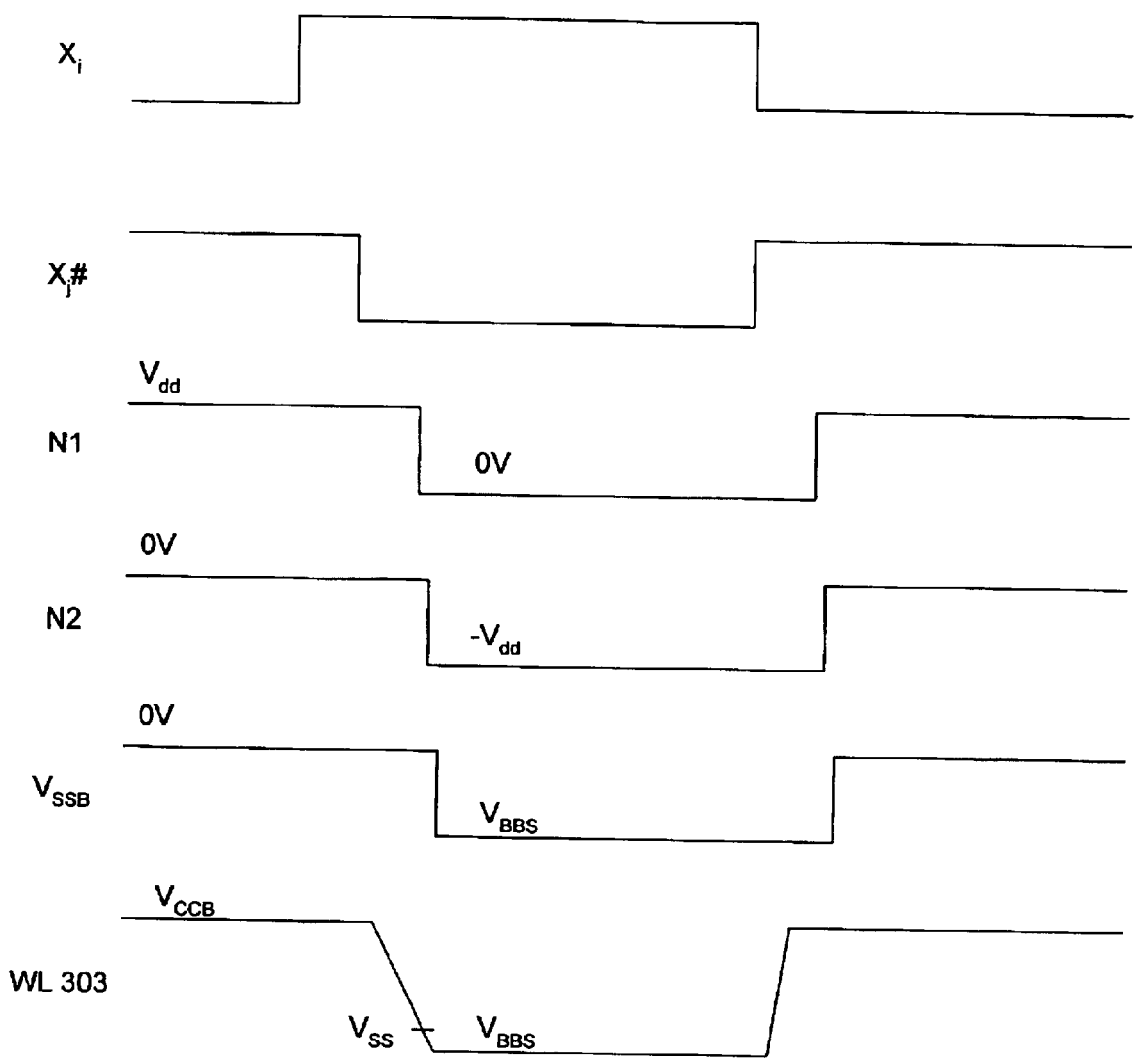
FIG. 8 is a waveform diagram illustrating various signals generated during the operation of the $V_{SSB}$ coupling circuit of FIG. 7.

FIG. 8 is a waveform diagram illustrating various signals generated during the operation of $V_{SSB}$ coupling circuit 700.

Prior to activating word line 303, the $X_i$ signal is low and the $X_j\#$ signal is high. Under these conditions, the chain of inverters 711–714 provides a logic high signal to node N1, thereby turning on n-channel transistor 704. As a result, the $V_{SSB}$ supply line is maintained at the $V_{SS}$ supply voltage (0 Volts). Also, prior to activating word line 303, the sub-threshold leakage of transistor 702 pulls node N2 to a voltage less than one threshold voltage drop ($V_t$) above $V_{BBS}$, thereby preventing transistor 701 from turning on.

As described above in connection with FIG. 5, the $X_i$ signal is driven high and then the $X_j\#$ signal is driven low to activate word line 303. Under these conditions, pull down transistor 503 (FIG. 5) of word line driver 500 turns on, thereby coupling word line 303 to the $V_{SSB}$ supply line. Immediately after transistor 503 is turned on, the low state of the $X_j\#$ is propagating through the chain of inverters 711–714 and has not reached node N1. During this time, n-channel transistor 704 remains on, coupling the $V_{SSB}$ supply line to receive the $V_{SS}$ supply voltage. Also during this time, the high state of node N1 pulls the source and drain of capacitor-coupled transistor 703 to a high state. Transistor 702 is connected as an MOS diode with its gate and drain connected to the $V_{BBS}$ supply line. Transistor 702 therefore limits the voltage at node N2 to no more than one threshold voltage ($V_t$) above the $V_{BBS}$ voltage, or to a potential approximately equal to the $V_{SS}$ supply voltage. Consequently, capacitor 703 is initially charged to a voltage approximately equal to the $V_{dd}$ supply voltage (i.e., the voltage across transistor 703 is approximately equal to $V_{dd}$).

When the low state of the $X_j\#$ signal reaches node N1, transistor 704 is turned off, thereby de-coupling the $V_{SSB}$ voltage supply line from the $V_{SS}$ voltage supply terminal. The low voltage at node N1 also causes capacitor 703 to pull node N2 down to a voltage equal to $-V_{dd}$. The $-V_{dd}$ voltage at node N2 turns on p-channel transistor 701, thereby coupling the $V_{SSB}$ voltage supply line to the $V_{BBS}$ voltage supply line. Note that only 32 word line drivers are coupled to the $V_{BBS}$ voltage supply line (and therefore the $V_{BBS}$ voltage generator 900) at this time. Because a relatively small number of word line drivers are connected to the $V_{BBS}$ supply line, the resulting junction leakage is relatively small.

The on-chip $V_{BBS}$ voltage generator 900 is designed to maintain $V_{BBS}$ at approximately –0.3 Volts below the $V_{SS}$ supply voltage despite the junction leakage. Note that during the activation of word line 303, this word line 303 is initially coupled to receive the $V_{SS}$ supply voltage. When the voltage of word line 303 drops below the $V_{dd}$ supply voltage, then word line 303 is coupled to receive the negative boosted voltage $V_{BBS}$. This limits the source-to-drain voltage of word line pull down transistor 503 to be less than $V_{CCB}$ minus $V_{BBS}$, thereby preventing transistor 503 from being exposed to high voltage stress.

To de-activate word line 303, the $X_j\#$ signal is driven high by row address decoder 510. In response, pull up transistor 501 in word line driver 500 is turned on, thereby pulling up word line 303 to the $V_{CCB}$ voltage. In $V_{SSB}$ coupling circuit 700, the high state of the $X_j\#$ signal propagates through the delay chain formed by inverters 711–714, thereby providing a high voltage at node N1 which turns on transistor 704. The high voltage at node N1 also couples node N2 to a voltage of about $V_{SS}$, thereby turning off transistor 701. Under these conditions, the $V_{SSB}$ voltage supply line is coupled to the $V_{SS}$ voltage supply terminal.

Voltage Reference Generation

The $V_{CCB}$ and $V_{SSB}$ voltages are generated by on-chip charge pump circuits in accordance with one embodiment of the present invention. FIG. 9A is a block diagram showing the general construction of the $V_{CCB}$ and $V_{SSB}$ boosted voltage generators 800 and 900 in accordance with one embodiment of the present invention. Each of the $V_{CCB}$ and $V_{SSB}$ boosted voltage generators consists of a ring oscillator 801, a charge pump 802 and a pump controller 803, which controls the operation of the oscillator 801 and thus charge pump 802. Ring oscillator 801 and charge pump 802 are conventional elements that are well documented in references such as U.S. Pat. Nos. 5,703,827 and 5,267,201.

FIG. 9B is a simplified schematic diagram of a charge pump control circuit 901 used in a conventional positive boosted voltage generator. Charge pump control circuit 901 includes a p-channel transistor 911 having a gate coupled to receive the $V_{dd}$ supply voltage, a source and bulk coupled to receive the positive boosted voltage $V_{boost+}$, and a drain coupled to a reference current source 912. The drain of transistor 911 is also connected to the Inhibit control line. Current source 912 can be replaced with a resistor.

When the $V_{boost+}$ voltage is higher than the $V_{dd}$ supply voltage by one threshold voltage ($V_{tp}$), transistor 911 is turned on. The source current from transistor 911 is compared to the reference current $I_{REF}$ provided by current source 912. As the potential difference between the $V_{boost+}$ and $V_{dd}$ voltages increases, the source current from transistor 911 increases. When the source current is larger than the reference current $I_{REF}$, the Inhibit control line is coupled to receive the $V_{boost+}$ voltage. The high state of the Inhibit signal disables the ring oscillator 801, thereby shutting down the charge pump 802 and stopping $V_{boost+}$ from going higher. Depending on the magnitude of the reference current $I_{REF}$, the boosted voltage $V_{boost+}$ can be regulated at a voltage equal to the $V_{dd}$ supply voltage plus one threshold voltage ($V_{tp}$) or higher. Note that the bulk of transistor 911 is coupled to receive the $V_{boost+}$ voltage so that the source-to-bulk junction of this transistor is not forward biased. However, this connection is possible only when the bulk of transistor 911 is an N-well which can be isolated from the substrate, or when transistor 911 is formed in an n-type substrate that is biased to a voltage equal to or more positive than $V_{boost+}$.

FIG. 9C is a simplified schematic diagram of a charge pump control circuit 902 used in a conventional negative boosted voltage generator. Charge pump control circuit 902 includes an n-channel transistor 921 having a gate coupled to receive the $V_{SS}$ supply voltage, a source and bulk coupled to receive the negative boosted voltage $V_{boost-}$, and a drain coupled to a reference current source 922. The drain of transistor 921 is also connected to the Inhibit# control line. Current source 922 can be replaced with a resistor.

When the $V_{boost-}$ voltage is lower than the $V_{SS}$ supply voltage by one threshold voltage ($V_{tn}$), transistor 921 is turned on. The drain current from transistor 921 is compared to the reference current $I_{REF}$ provided by current source 922. As the potential difference between $V_{boost-}$ and $V_{SS}$ increases, the drain current from transistor 921 increases. When the drain current is larger than the reference current $I_{REF}$, the Inhibit# control line is coupled to receive the $V_{boost-}$ voltage. The low state of the Inhibit# signal disables the ring oscillator 801, thereby shutting down the charge pump 802 and stopping the $V_{boost-}$ voltage from going more negative. Depending on the magnitude of the reference current $I_{REF}$, the $V_{boost-}$ voltage can be regulated at a voltage equal to $V_{SS}$ minus one threshold voltage ($V_{tn}$) or more. Note that the bulk of transistor 921 is coupled to receive the $V_{boost-}$ voltage so that the source-to-bulk junction of this transistor is not forward biased. This connection is possible only when the bulk of transistor 921 is a p-well which can be isolated from the substrate, or when transistor 921 is formed in a p-type substrate that is biased a voltage equal to or more negative than $V_{boost-}$.

Charge pump control circuits 901 and 902 cannot co-exist in a conventional logic process because such a process has the limitation that only one type of transistor can be isolated in a well. That is, both n-wells and p-wells are not available in a conventional logic process as defined herein. Moreover, because the p-type substrate of memory cell 300 is biased at the $V_{SS}$ voltage (FIG. 3B), the p-type substrate of memory cell 300 cannot be biased at a voltage equal to or more negative than the negative boosted word line voltage $V_{BBS}$. Furthermore, because charge pump control circuit 901 results in a $V_{boost+}$ voltage greater than or equal to $V_{dd}$ plus $V_{tp}$, this charge pump control circuit 901 cannot generate a $V_{boost+}$ voltage greater than the $V_{dd}$ supply voltage, but less than the $V_{dd}$ supply voltage plus the threshold voltage $V_{tp}$ as required by the present invention.

Similarly, because charge pump control circuit 902 results in a $V_{boost-}$ voltage less than or equal to the $V_{SS}$ supply voltage minus the threshold voltage $V_{tn}$, this charge pump control circuit 902 cannot generate a $V_{boost-}$ voltage less than the $V_{SS}$ supply voltage, but greater than the $V_{SS}$ supply voltage minus the absolute value of the threshold voltage $V_{tn}$ as required by the present invention.

Figure 10:
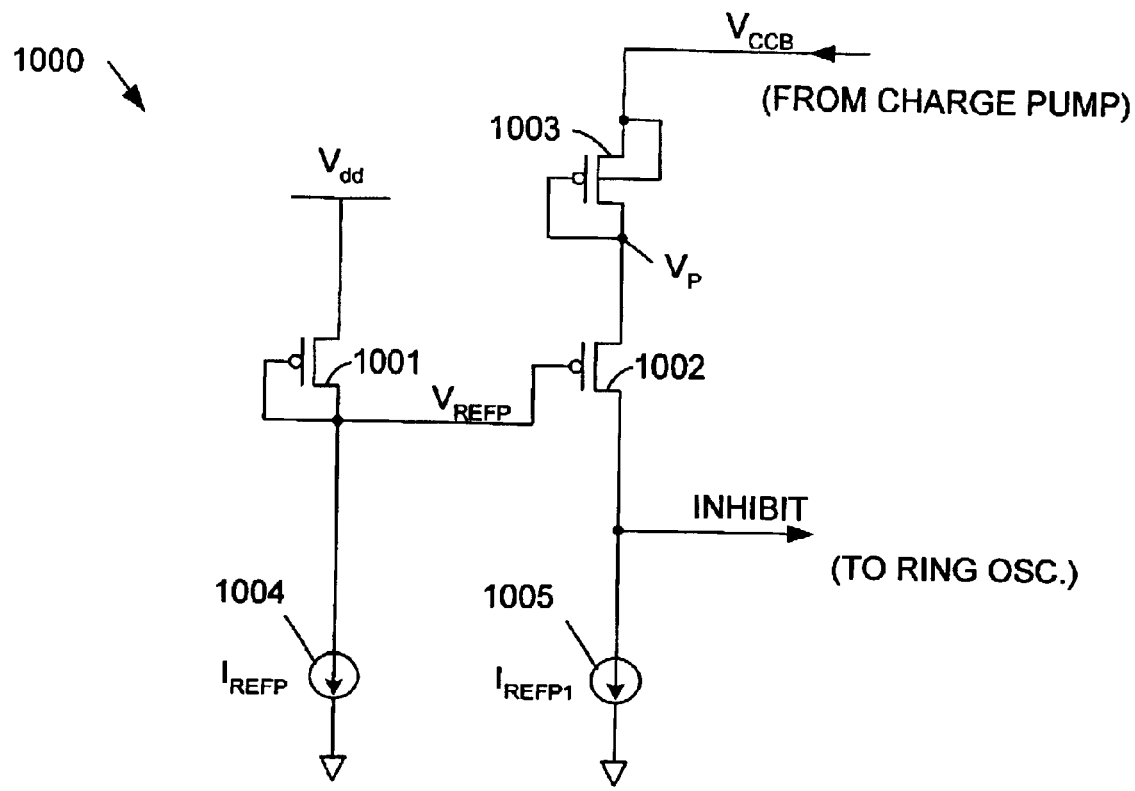
FIG. 10 is a schematic diagram of a $V_{CCB}$ charge pump control circuit in accordance with the one embodiment of the present invention.

FIG. 10 is a schematic diagram of a $V_{CCB}$ charge pump control circuit 1000 in accordance with the one embodiment of the present invention. $V_{CCB}$ charge pump control circuit 1000 is used to replace charge pump control circuit 803 (FIG. 9A), thereby creating a $V_{CCB}$ reference voltage generation circuit that is capable of generating the desired $V_{CCB}$ voltage. $V_{CCB}$ charge pump control circuit 1000 includes p-channel transistors 1001–1003 and reference current sources 1004–1005. The source of p-channel transistor 1001 is coupled to receive the $V_{dd}$ supply voltage, and the gate and drain of p-channel transistor 1001 are commonly connected to reference current source 1004. P-channel transistor 1001 is thereby connected as a diode between the $V_{dd}$ voltage supply and reference current source 1004. Reference current source 1004 generates a reference current, $I_{REFP}$, which establishes a reference voltage, $V_{REFP}$, on the gate of p-channel transistor 1002.

P-channel transistor 1001 has a channel width of $W_p$. P-channel transistors 1001 and 1002 have the same channel lengths. However, p-channel transistor 1002 has a channel width of m times $W_p$, where m is a multiplying constant. The drain of transistor 1002 is connected to another reference current source 1005, which generates a reference current, $I_{REFP1}$. The source of transistor 1002 is connected to node $V_p$. Node $V_p$ is also connected to the drain and gate of p-channel transistor 1003. The source of transistor 1003 is connected to receive the positive boosted voltage $V_{CCB}$ from charge pump 802. If the reference currents $I_{REFP}$ and $I_{REFP1}$ are equal, and transistor 1002 has the same channel width as transistor 1001 (i.e., m=1), then node $V_p$ will be held at a voltage equal to the $V_{dd}$ supply voltage. Under these conditions, the positive boosted voltage $V_{CCB}$ will be higher than the $V_{dd}$ supply voltage by a voltage greater than the absolute value of the threshold voltage $V_{tp}$ of p-channel transistor 1003.

In the present embodiment, reference current $I_{REFP}$ is set approximately equal to reference current $I_{REFP1}$, and the multiplying constant m is set equal to four. Because the channel length of transistor 1002 is four times longer than the channel length of transistor 1001, the source-to-gate voltage of transistor 1002 is less than the source-to-gate voltage of transistor 1001. As a result, the voltage on node $V_p$ is less than the $V_{dd}$ supply voltage. For example, if reference currents $I_{REFP}$ and $I_{REFP1}$ are both set equal to about 50 μA, then the voltage on node $V_p$ will be about 0.2 Volts less than the $V_{dd}$ supply voltage. The channel width of transistor 1003 is selected to be relatively large (e.g., on the order of 50 μm) such that the source-to-gate voltage of transistor 1003 is approximately equal to the threshold voltage of transistor 1003 (e.g., 0.5 Volts). As a result, the $V_{CCB}$ voltage is maintained at a voltage about 0.3 Volts greater than the $V_{dd}$ supply voltage. The $V_{CCB}$ voltage is therefore less than one threshold voltage greater than the $V_{dd}$ supply voltage.

In another embodiment, p-channel transistor 1003 can be eliminated, such that the $V_{CCB}$ voltage is provided directly to node $V_p$. However, in this embodiment, the channel width of transistor 1002 must be selected to smaller than the channel width $W_p$ of transistor 1001. That is, the multiplier constant m must be selected to be less than one, such that the source-to-gate voltage of transistor 1002 is greater than the source-to-gate voltage of transistor 1001 by about 0.3 Volts (or another voltage that is less than the p-channel threshold voltage).

Figure 11:
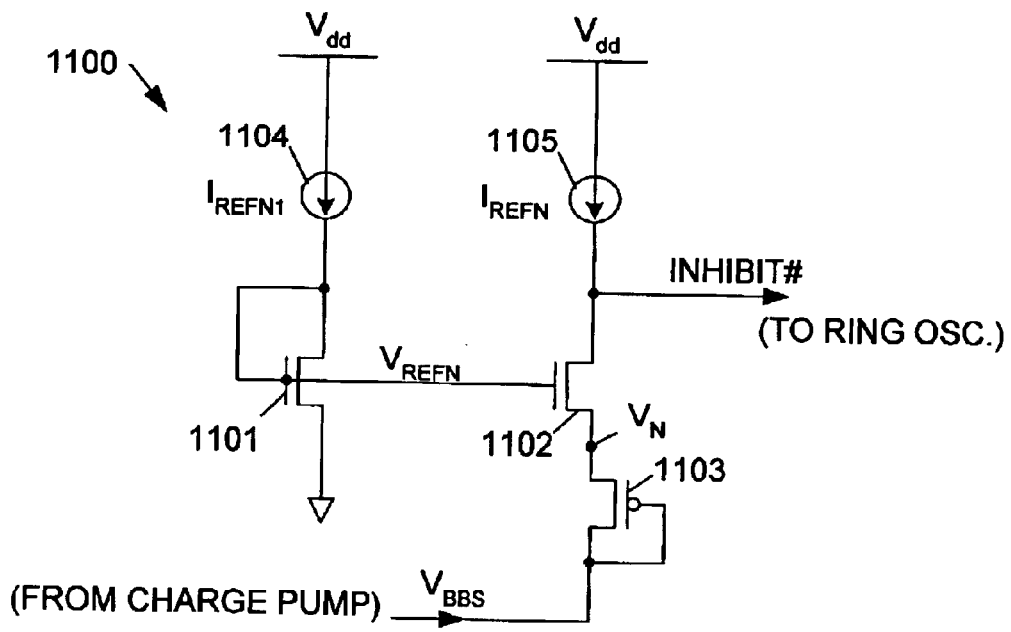
FIG. 11 is a schematic diagram of a $V_{BBS}$ charge pump control circuit in accordance with the one embodiment of the present invention.

FIG. 11 is a schematic diagram of a $V_{BBS}$ charge pump control circuit 1100 in accordance with the one embodiment of the present invention. $V_{BBS}$ charge pump control circuit 1100 is used to replace charge pump control circuit 803 (FIG. 9A), thereby creating a $V_{BBS}$ reference voltage generation circuit that is capable of generating the desired $V_{BBS}$ voltage. $V_{BBS}$ charge pump control circuit 1100 includes n-channel transistors 1101–1102, p-channel transistor 1103 and reference current sources 1104–1105. The source of n-channel transistor 1101 is connected to receive the $V_{SS}$ supply voltage. The drain and gate of transistor 1101 are commonly connected to reference current source 1104. Thus, transistor 1101 is connected as a diode. Reference current source 1104 is connected between the $V_{dd}$ voltage supply and the commonly connected drain and gate drain of n-channel transistor 1101. Reference current source 1104 provides a reference current $I_{REFN1}$ to n-channel transistor 1101. The reference current $I_{REFN1}$ establishes a reference voltage, $V_{REFN}$, on the gate of n-channel transistor 1102.

N-channel transistor 1101 has a channel width of $W_n$. N-channel transistors 1101 and 1102 have the same channel lengths. However, n-channel transistor 1102 has a channel width of n times $W_n$, where n is a multiplying constant. The drain of transistor 1102 is connected to another reference current source 1105, which generates a reference current, $I_{REFN}$. The source of transistor 1102 is connected to node $V_N$. Node $V_N$ is also connected to the source of p-channel transistor 1103. The drain and gate of transistor 1103 are commonly connected to receive the negative boosted voltage $V_{BBS}$. If the reference currents $I_{REFN}$ and $I_{REFN1}$ are equal, and transistor 1102 has the same channel width as transistor 1101 (i.e., n=1), then node $V_N$ will be held at a voltage equal to the $V_{SS}$ supply voltage. Under these conditions, the negative boosted voltage $V_{BBS}$ will be regulated at a voltage approximately one threshold voltage ($V_{tp}$) below the $V_{SS}$ supply voltage.

In the present embodiment, reference current $I_{REFN}$ is set approximately equal to reference current $I_{REFN1}$, and the multiplying constant n is set equal to four. Because the channel width of transistor 1102 is four times longer than the channel width of transistor 1101, the source-to-gate voltage of transistor 1102 is less than the source-to-gate voltage of transistor 1101. As a result, the voltage potential on node $V_N$ is higher than the $V_{SS}$ supply voltage. For example, if reference currents $I_{REFN}$ and $I_{REFN1}$ are both set equal to about 50 μA, then the voltage on node $V_N$ will be about 0.2 Volts greater than the $V_{SS}$ supply voltage. The channel width of transistor 1103 is selected to be relatively large (e.g., on the order of 50 μm) such that the source-to-gate voltage of transistor 1103 is approximately equal to the threshold voltage of transistor 1103 (e.g., 0.5 Volts). As a result, the $V_{BBS}$ voltage is maintained at a voltage about 0.3 Volts less than the $V_{SS}$ supply voltage. The $V_{BBS}$ voltage is therefore less than one threshold voltage less than the $V_{SS}$ supply voltage.

In another embodiment, p-channel transistor 1103 can be eliminated, such that the $V_{BBS}$ voltage is provided directly to node $V_N$. However, in this embodiment, the channel width of transistor 1102 must be selected to smaller than the channel width $W_n$ of transistor 1101. That is, the multiplier constant n must be selected to be less than one, such that the source-to-gate voltage of transistor 1102 is greater than the source-to-gate voltage of transistor 1101 by about 0.3 Volts (or another voltage that is less than the p-channel threshold voltage).

It is desirable to keep the $V_{CCB}$ and $V_{BBS}$ voltages relatively constant for variations in temperature. In general, the transistor threshold voltage $V_t$ tends to decrease as the temperature increases. To compensate for this temperature effect, reference current sources 1004 and 1104 are constructed such that reference currents $I_{REFP}$ and $I_{REFN1}$ have negative temperature coefficients (i.e., reference currents $I_{REFP}$ and $I_{REFN1}$ decrease as the temperature increases).

Figure 12:
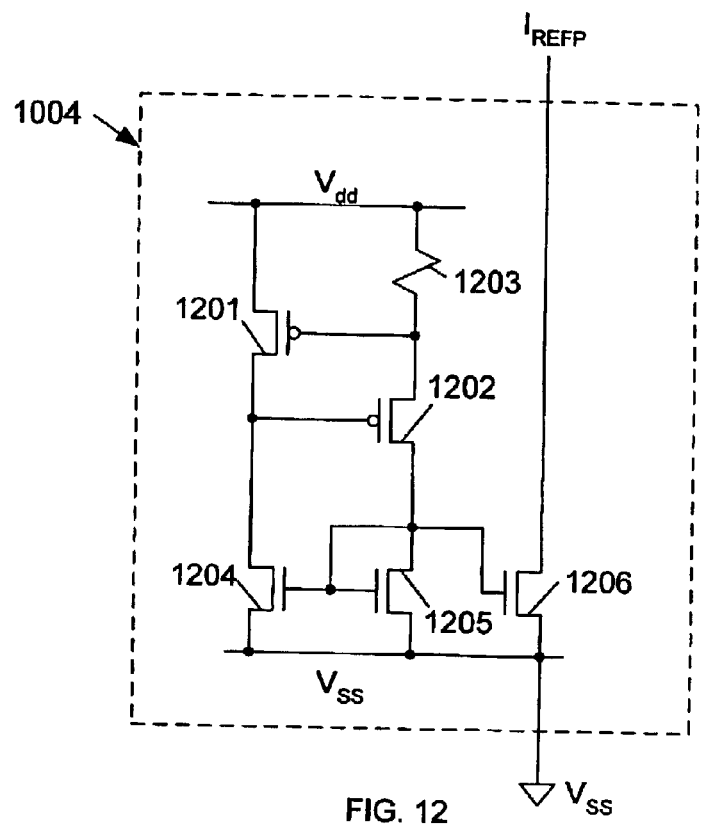
FIGS. 12–17 are schematic diagrams of reference current sources in accordance with various embodiments of the present invention.

FIG. 12 is a schematic diagram of reference current source 1004 in accordance with one embodiment of the present invention. Reference current source 1004 includes p-channel transistors 1201–1202, resistor 1203 and n-channel transistors 1204–1206. Resistor 1203 is connected between the $V_{dd}$ voltage supply and the gate of transistor 1201, thereby setting the bias for transistor 1201. The current $I_R$ through resistor 1203 is equal to the threshold voltage $V_{tp}$ of transistor 1201 divided by the resistance of resistor 1203. The current $I_R$ is therefore directly related to the threshold voltage $V_{tp}$. The current $I_R$ flows through p-channel transistor 1202 and n-channel transistor 1205.

The gate and source of transistor 1202 are coupled to the drain and gate, respectively, of transistor 1201. The voltage on the gate of transistor 1202 is translated to the drain of transistor 1202. N-channel transistors 1204–1206 each have a source terminal coupled to the $V_{SS}$ voltage supply and a gate terminal coupled to the drain of transistor 1202, thereby forming a current mirror circuit. The current $I_R$ is thereby translated to transistor 1206. As a result, the current through n-channel transistor 1206 (i.e., $I_{REFP}$) is directly related to the threshold voltage $V_{tp}$ of p-channel transistor 1201.

Reference current source 1004 provides temperature compensation as follows.

As the temperature increases, the threshold voltages $V_{tp}$ of transistors 1002 and 1003 (FIG. 10) decrease, thereby causing the $V_{CCB}$ voltage to decrease. However, as the temperature increases, the threshold voltage $V_{tp}$ of transistor 1201 (FIG. 12) decreases. In response, the current $I_R$ decreases, thereby reducing the $I_{REFP}$ current. As a result, the gate-to-source voltage of p-channel transistor 1001 (FIG. 10) decreases, thereby increasing the $V_{REFP}$ voltage. The increased $V_{REFP}$ voltage, in turn, causes the voltage $V_p$ to increase, thereby increasing the $V_{CCB}$ voltage. The temperature effect of the threshold voltage $V_{tp}$ of transistors 1002 and 1003 is thereby partially compensated by the negative temperature coefficient of the $I_{REFP}$ current. In this manner, reference current source 1004 provides temperature compensation to $V_{CCB}$ pump control circuit 1000.

Figure 13:
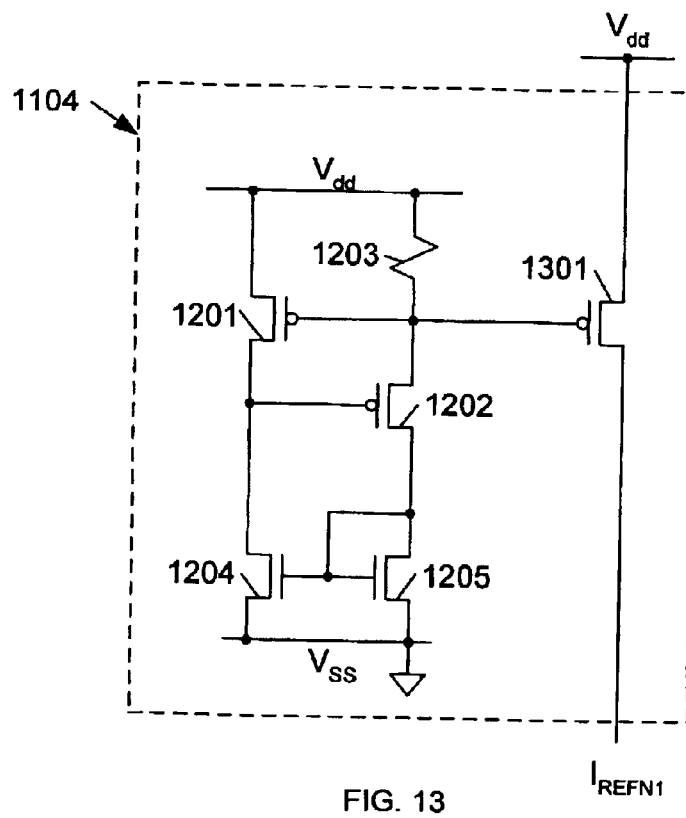

FIG. 13 is a schematic diagram of reference current source 1104 in accordance with one embodiment of the present invention. Because reference current source 1104 is similar to reference current source 1004 (FIG. 12), similar elements in FIGS. 12 and 13 are labeled with similar reference numbers. Thus, reference current source 1104 includes p-channel transistors 1201–1202, resistor 1203 and n-channel transistors 1204–1205. In addition, reference current source 1104 includes a p-channel transistor 1301 having a gate coupled to the gate of transistor 1201, and a source coupled to receive the $V_{dd}$ supply voltage.

Reference current source 1104 provides temperature compensation as follows.

As the temperature increases, the threshold voltages $V_t$ of transistors 1102 and 1103 (FIG. 11) decrease, thereby causing the $V_{BBS}$ voltage to increase. However, as the temperature increases, the threshold voltage $V_{tp}$ of p-channel transistor 1201 decreases. As a result, the current $I_R$ decreases. Because transistors 1201 and 1301 are coupled to form a current mirror circuit, the decrease in the current $I_R$ results in a decrease in the current $I_{REFN1}$. A decrease in the current $I_{REFN1}$, in turn, causes a decrease in the voltage $V_{REFN}$ (FIG. 11). The decrease in $V_{REFN}$ results in a decrease of the voltage $V_N$, which in turn, causes a decrease in the $V_{BBS}$ voltage. In this manner, reference current source 1104 provides temperature compensation to $V_{BBS}$ pump control circuit 1100.

If the $I_{REFP1}$ current is temperature independent, then reference current source 1004 (FIG. 12) mainly compensates for the temperature effect of transistor 1002, thereby leaving the temperature effect of transistor 1003 largely uncompensated. Similarly, if the $I_{REFN}$ current is temperature independent, then reference current source 1104 (FIG. 13) mainly compensates for the temperature effect of transistor 1102, leaving the temperature effect of transistor 1103 largely uncompensated. To compensate for the uncompensated temperature effects of transistors 1003 and 1103, reference current sources 1005 and 1105 are constructed such that reference currents $I_{REFP1}$ and $I_{REFN}$ have positive temperature coefficients (i.e., reference currents $I_{REFP1}$ and $I_{REFN}$ increase as the temperature increases).

Figure 14:
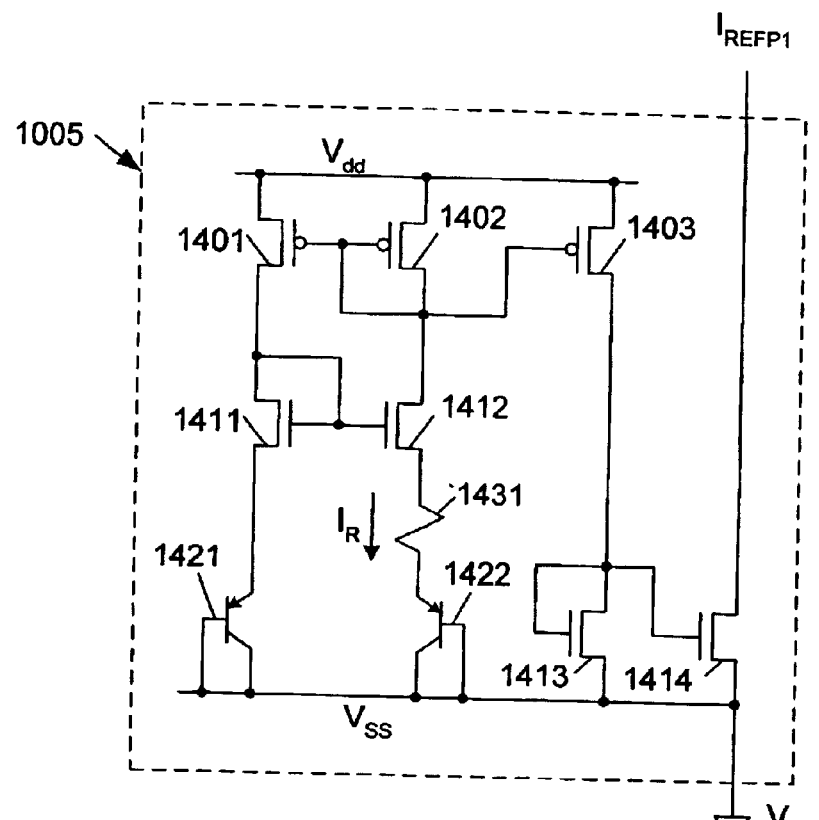

FIG. 14 is a schematic diagram of reference current source 1005 in accordance with one embodiment of the present invention. Reference current source 1005 includes p-channel transistors 1401–1403, n-channel transistors 1411–1414, PNP bipolar transistors 1421–1422 and resistor 1431. Transistors 1401, 1411 and 1421 are connected in series between the $V_{dd}$ and $V_{SS}$ voltage supplies. Transistors 1402, 1412 and 1422 and resistor 1431 are connected in series between the $V_{dd}$ and $V_{SS}$ voltage supplies. Transistor 1403 is connected in series with parallel-connected transistors 1413–1414 between the $V_{dd}$ and $V_{SS}$ voltage supplies. P-channel transistors 1401–1403 are configured to form a current mirror circuit, such that the same current flows through all three of these transistors 1401–1403. The emitter of transistor 1422 is selected to be m times larger than the emitter of transistor 1421, where m is a multiplying constant. In the described embodiment, the multiplying constant m is equal to 4. The multiplying constant m and the resistor value of resistor 1431 is selected such that the resultant current $I_{REFP1}$ is approximately equal to $I_{REFP}$. The voltages at the sources of transistors 1411 and 1412 are maintained at the same voltage by transistors 1401–1402 and 1411–1412. As a result, the voltage across transistor 1421 is equal to the voltage across resistor 1431 and transistor 1422.

The operation of reference current source 1005 is well documented in references such as "Analysis and Design of Analog Integrated Circuits", by P. R. Gray and R. G. Meyer, pp. 330–333, which is hereby incorporated by reference. The current $I_R$ through resistor 1431 is equal to $V_T/R \ln(m)$. $V_T = kT/q$, where k is equal to Boltzmann's constant, T is equal to absolute temperature, and q is equal to electron charge. The current through resistor 1431 is therefore directly related to temperature. The current $I_R$ through resistor 1431 is translated to create the $I_{REFP1}$ current through transistors 1403 and 1413–1414. As a result, the $I_{REFP1}$ current is directly related to temperature. Thus, as temperature increases, the $I_{REFP1}$ current increases. The increased $I_{REFP1}$ current increases the gate-to-source voltages of transistors 1002 and 1003 in FIG. 10, thereby offsetting the decrease in the threshold voltage $V_{tp}$ of transistor 1003 which occurs with increases in temperature. As described above, the decrease of the threshold voltage $V_{tp}$ of transistor 1003 tends to decrease the $V_{CCB}$ voltage. However, the increased $I_{REFP1}$ current tends to increase the $V_{CCB}$ voltage. The net result is that the $V_{CCB}$ voltage is maintained relatively constant throughout the operating temperature range.

Figure 15:
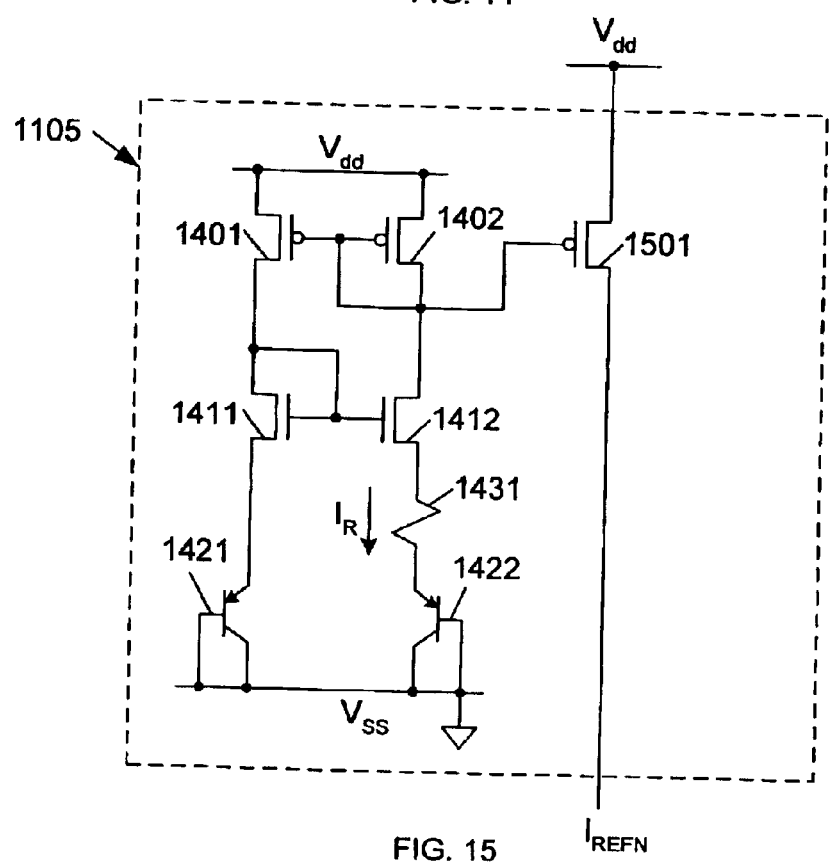

FIG. 15 is a schematic diagram of reference current source 1105 in accordance with one embodiment of the present invention. Reference current source 1105 includes p-channel transistors 1401–1402 and 1501, n-channel transistors 1411–1412, PNP bipolar transistors 1421–1422 and resistor 1431. Transistors 1401–1402, 1411–1412, 1421–1422 and resistor 1432 are connected in the manner described above for FIG. 14. In addition, the gate of transistor 1501 is commonly connected to the gates of transistors 1401–1402. As described above, the current $I_R$ through resistor 1431 is directly related to temperature. Thus, as the temperature increases, the $I_R$ current through resistor 1431 increases. This increased current is translated to transistor 1501, thereby resulting in an increased $I_{REFN}$ current. The increased $I_{REFN}$ current increases the gate-to-source voltages of transistors 1102 and 1103 in FIG. 11, thereby offsetting the decrease in threshold voltage $V_{tp}$ of transistor 1103 in FIG. 11. As described above, the decrease in the threshold voltage $V_{tp}$ of transistor 1103 tends to increase the $V_{BBS}$ voltage. However, the increased $I_{REFN}$ current tends to decrease the $V_{BBS}$ voltage. The result is that the $V_{BBS}$ voltage is maintained relatively constant in the operating temperature range of the reference current circuit 1104.

Figure 16:
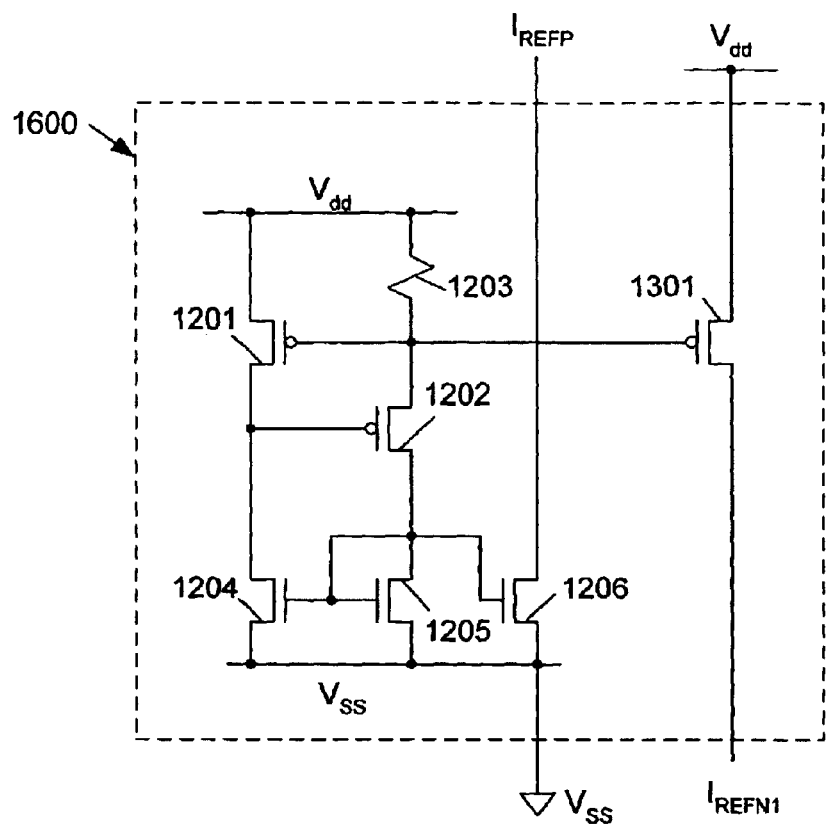

FIG. 16 is a schematic diagram illustrating reference current circuit 1600 in accordance with another embodiment of the present invention. Reference current circuit 1600 combines reference current circuits 1004 and 1104 in a single circuit, thereby reducing the required layout area of the resulting circuit. Similar elements in FIGS. 12, 13 and 16 are labeled with similar reference numbers. Reference current circuit 1600 operates in the same manner as reference current circuits 1104 and 1104.

Figure 17:
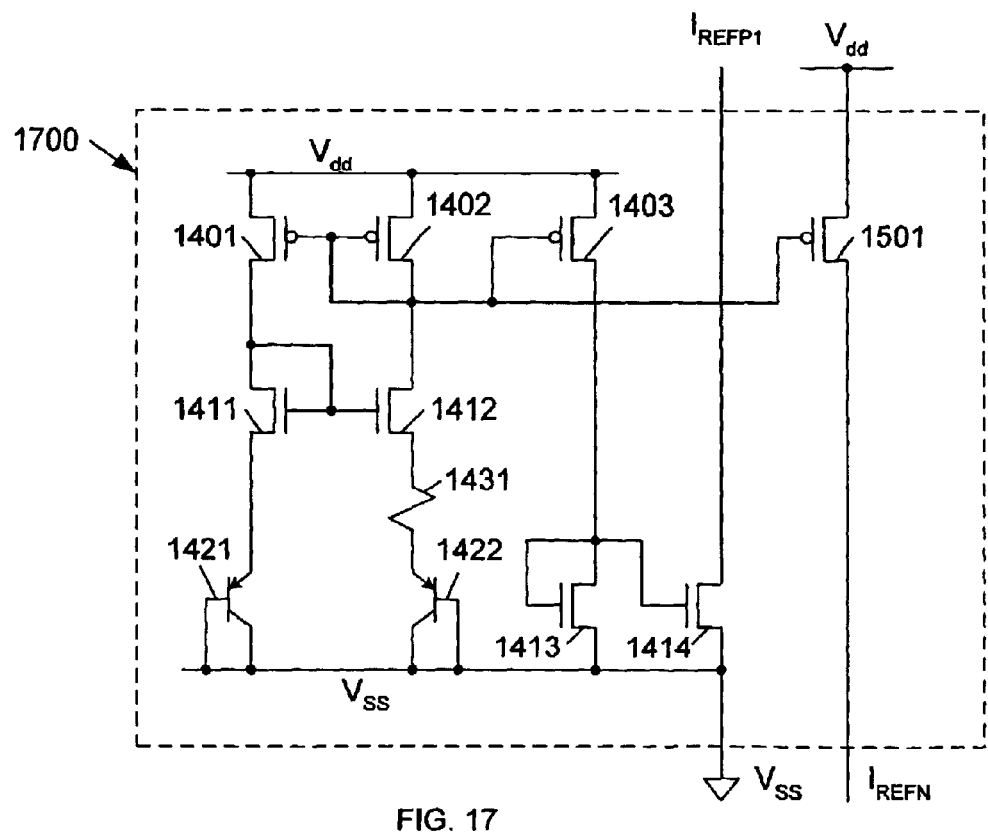

FIG. 17 is a schematic diagram illustrating reference current circuit 1700 in accordance with another embodiment of the present invention. Reference current circuit 1700 combines reference current circuits 1005 and 1105 in a single circuit, thereby reducing the required layout area of the resulting circuit. Similar elements in FIGS. 14, 15 and 17 are labeled with similar reference numbers. Reference current circuit 1700 operates in the manner as reference current circuits 1005 and 1105.

The preferred embodiment described above uses PMOS transistors for the memory cells. The p-channel transistors are fabricated in N-well on P-substrate. In another embodiment, the memory cells can be fabricated using NMOS transistors. In such an embodiment, the word line is activated high and deactivated low.

Figure 18:
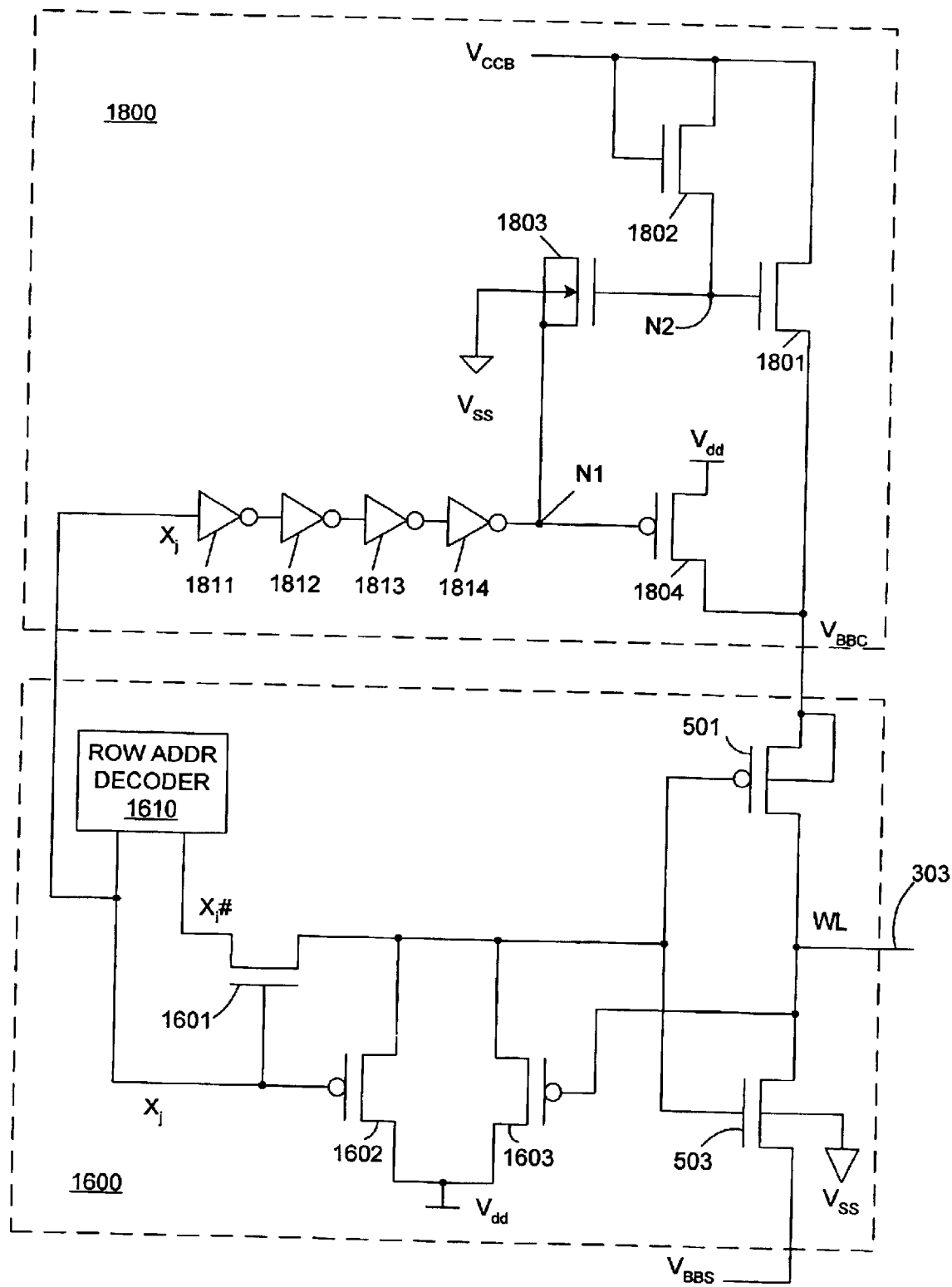
FIG. 18 is a schematic diagram of a word line driver and a $V_{BBC}$ voltage coupling circuit in accordance with an embodiment of the present invention that uses NMOS transistors to form the DRAM cells.

FIG. 18 is a schematic diagram illustrating word line driver circuit 1600 and a $V_{BBC}$ coupling circuit 1800 that can be used to drive memory cells constructed from NMOS transistors. Word line driver circuit 1600 includes p-channel pull-up transistor 501 and n-channel pull-down transistor 503, which were described above in connection with word line driver 500 (FIG. 5). The remainder of word line driver 1600 is a reciprocal circuit of word line driver 500. The reciprocal circuit is obtained by replacing PMOS transistors NMOS transistors, replacing NMOS transistors with PMOS transistors, replacing connections to the $V_{dd}$ voltage supply with connections to the $V_{SS}$ voltage supply, and replacing connections to the $V_{SS}$ voltage supply with connections to the $V_{dd}$ voltage supply. Thus, in addition to pull up and pull down transistors 501 and 503, word line driver 1600 includes n-channel transistor 1601, p-channel transistors 1602–1603 and row address decoder 1610.

N-channel pull-down transistor 503 of word line driver 500 is coupled directly to $V_{BBS}$ voltage generator 900. In this embodiment, the $V_{BBS}$ voltage generator provides a $V_{BBS}$ voltage about –0.3 V below the $V_{SS}$ supply voltage. The p-channel pull-up transistor 501 of word line driver 500 is coupled to receive a $V_{BBC}$ voltage from $V_{BBC}$ coupling circuit 1800. Row address decoder 1610 provides control signals $X_i\#$ and $X_j$, which are the inverse of the control signals $X_i$ and $X_j\#$ provided by row address decoder 510 (FIG. 5).

$V_{BBC}$ coupling circuit 1800 is the reciprocal the coupling circuit 700 of FIG. 7. Thus, $V_{BBC}$ coupling circuit 1800 includes n-channel transistors 1801–1803, p-channel transistor 1804 and inverters 1811–1814, as illustrated.

Prior to activating word line 303, the $X_i\#$ signal is high and the $X_j$ signal is low. Under these conditions, transistor 1602 is turned on, thereby applying the $V_{dd}$ supply voltage to the gates of transistors 501 and 503. As a result, pull-down transistor 503 turns on, thereby providing the $V_{BBS}$ voltage to word line 303. Also under these conditions, the chain of inverters 1811–1814 provides a logic low signal to node N1, thereby turning on p-channel transistor 1804. As a result, the $V_{BBC}$ supply line is maintained at the $V_{dd}$ supply voltage. Also, prior to activating word line 303, the sub-threshold leakage of transistor 1802 pulls node N2 to a voltage greater than one threshold voltage drop ($V_t$) below $V_{CCB}$, thereby preventing transistor 1801 from turning on.

The $X_i\#$ signal is driven low and then the $X_j$ signal is driven high to activate word line 303. Under these conditions, pull up transistor 501 turns on, thereby coupling word line 303 to the $V_{BBC}$ voltage coupling circuit 1800. Immediately after transistor 501 is turned on, the high state of the $X_j$ signal is propagating through the chain of inverters 1811–1814 and has not reached node N1. During this time, p-channel transistor 1804 remains on, coupling the $V_{BBC}$ supply line to receive the $V_{dd}$ supply voltage. Also during this time, the low state of node N1 pulls the source and drain of capacitor-coupled transistor 1803 to a low state. Transistor 1802 is connected as an MOS diode with its gate and drain connected to the $V_{CCB}$ supply line. Transistor 1802 therefore limits the voltage at node N2 to no more than one threshold voltage ($V_t$) below the $V_{CCB}$ voltage, or to a potential approximately equal to the $V_{dd}$ supply voltage. Consequently, capacitor 1803 is initially charged to a voltage approximately equal to the $V_{dd}$ supply voltage (i.e., the voltage across transistor 1803 is approximately equal to $V_{dd}$).

When the high state of the $X_j$ signal reaches node N1, transistor 1804 is turned off, thereby de-coupling the $V_{BBC}$ voltage supply line from the $V_{dd}$ voltage supply terminal. The high voltage at node N1 also causes capacitor 1803 to pull node N2 up to a voltage equal to $2V_{dd}$. The $2V_{dd}$ voltage at node N2 turns on n-channel transistor 1801, thereby coupling the $V_{CCB}$ voltage supply line to the $V_{BBC}$ voltage supply line.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A method of forming a dynamic random access memory (DRAM) cell comprising:

fabricating an access transistor of the DRAM cell with a thin gate dielectric layer of a logic process; and fabricating a storage capacitor of the DRAM cell with a thick dielectric layer, having a thickness greater than the thin gate dielectric layer.

2. The method of claim 1, wherein the thick dielectric layer is at least about 20 percent thicker than the thin gate dielectric layer.

3. The method of claim 1, further comprising the step of fabricating the storage capacitor of the DRAM cell in a region that is at least partially recessed.

4. The method of claim 1, wherein the thin gate dielectric layer has a thickness in the range of about 15 to 20 Angstroms, and wherein the thick dielectric layer has a thickness in the range of about 25 to 50 Angstroms.

5. The method of claim 1, wherein the thin gate dielectric layer and the thick dielectric layer are silicon oxide layers fabricated using a dual-oxide logic process.

6. The method of claim 5, further comprising forming the thick dielectric layer from a thick gate dielectric layer of the logic process.

7. A method of forming a dynamic random access memory (DRAM) cell comprising:

fabricating an access transistor of the DRAM cell with a thin gate dielectric layer of a logic process; and fabricating a storage capacitor of the DRAM cell with a thick gate dielectric layer of the logic process, wherein the thick gate dielectric layer is also used to fabricate transistors external to the DRAM cell.

8. The method of claim 7, wherein the thick gate dielectric layer is at least about 20 percent thicker than the thin gate dielectric layer.

9. The method of claim 7, further comprising the step of fabricating the storage capacitor of the DRAM cell in a region that is at least partially recessed.

10. The method of claim 7, wherein the thin gate dielectric layer has a thickness in the range of about 15 to 20 Angstroms, and wherein the thick gate dielectric layer has a thickness in the range of about 25 to 50 Angstroms.

11. The method of claim 7, wherein the thin gate dielectric layer and the thick gate dielectric layer are silicon oxide layers fabricated using a dual-oxide logic process.

* * * * *